(12) United States Patent
Long

(10) Patent No.: US 12,519,277 B2
(45) Date of Patent: Jan. 6, 2026

(54) METHOD OF USING AN ORGANIZER FOR MANUFACTURE OF ELECTRONIC DEVICE WITH CABLED INTERCONNECTS

(71) Applicant: Amphenol Corporation, Wallingford, CT (US)

(72) Inventor: Michael D. Long, Hershey, PA (US)

(73) Assignee: Amphenol Corporation, Wallingford, CT (US)

( * ) Notice: Subject to any disclaimer, the term of this patent is extended or adjusted under 35 U.S.C. 154(b) by 677 days.

(21) Appl. No.: 17/861,006

(22) Filed: Jul. 8, 2022

(65) Prior Publication Data

US 2023/0012133 A1 Jan. 12, 2023

Related U.S. Application Data

(60) Provisional application No. 63/220,104, filed on Jul. 9, 2021.

(51) Int. Cl.
| | |
|---|---|
| *H01R 43/20* | (2006.01) |
| *H01R 12/53* | (2011.01) |
| *H01R 12/70* | (2011.01) |
| *H01R 12/72* | (2011.01) |
| *H01R 13/502* | (2006.01) |

(Continued)

(52) U.S. Cl.
CPC ........... *H01R 43/205* (2013.01); *H01R 12/53* (2013.01); *H01R 12/7029* (2013.01); *H01R 12/727* (2013.01); *H01R 13/502* (2013.01); *H01R 13/518* (2013.01); *H01R 43/00* (2013.01); *H05K 3/306* (2013.01); *H05K 7/026* (2013.01); *H05K 13/0447* (2013.01); *H05K 2203/0152* (2013.01);

(Continued)

(58) Field of Classification Search
CPC .. H01R 12/53; H01R 12/7029; H01R 12/716; H01R 12/727; H01R 12/75; H01R 13/502
See application file for complete search history.

(56) References Cited

U.S. PATENT DOCUMENTS

| 2,976,608 A | 3/1961 | Busler |
| 3,074,155 A | 1/1963 | Hahn et al. |

(Continued)

FOREIGN PATENT DOCUMENTS

WO WO 2019/195319 A1 10/2019

*Primary Examiner* — Minh N Trinh
(74) *Attorney, Agent, or Firm* — Wolf, Greenfield & Sacks, P.C.

(57) ABSTRACT

A method and subassembly for efficiently and reliably assembling a high performance electronic device. The electronic device may include numerous cabled interconnects in a subassembly subsequently mechanically and electrically connected to a PCB populated with high performance electronic components. First ends of cables in the cabled interconnects may be terminated by a first type of connector configured for connection to the PCB via downward force. Second ends of the cables may be terminated with a second type of connectors that may make connections to other portions of an electronic system incorporating the electronic device. According to the method, the connectors at the first ends of the cables may be releasably held within an organizer. The connectors may be simply mounted to the PCB by positioning the organizer with respect to the PCB, releasing the connectors from the organizer, and pushing the connectors into engagement with mounting locations on the PCB.

20 Claims, 24 Drawing Sheets

(51) Int. Cl.
*H01R 13/518* (2006.01)
*H01R 43/00* (2006.01)
*H05K 3/30* (2006.01)
*H05K 7/02* (2006.01)
*H05K 13/04* (2006.01)

(52) U.S. Cl.
CPC ................ *H05K 2203/0156* (2013.01); *H05K 2203/016* (2013.01)

(56) References Cited

U.S. PATENT DOCUMENTS

| | | | | |
|---|---|---|---|---|
| 3,441,853 | A | * | 4/1969 | Bodine .................. H05K 7/103 |
| | | | | 361/767 |
| 3,535,763 | A | | 10/1970 | Helton |
| 4,061,405 | A | * | 12/1977 | Minter ................ H01R 12/721 |
| | | | | 29/760 |
| 4,077,117 | A | | 3/1978 | Gavin |
| 4,131,982 | A | | 1/1979 | Rose et al. |
| 4,188,704 | A | | 2/1980 | Gavin |
| 4,206,543 | A | | 6/1980 | Chisholm |
| 4,556,268 | A | * | 12/1985 | Noschese ............... H01R 12/82 |
| | | | | 439/267 |
| 4,924,179 | A | | 5/1990 | Sherman |
| 6,641,433 | B2 | | 11/2003 | Devine et al. |
| 6,893,293 | B2 | | 5/2005 | Ice et al. |
| 7,148,428 | B2 | | 12/2006 | Meier et al. |
| 7,713,077 | B1 | | 5/2010 | McGowan et al. |
| 8,014,165 | B2 | | 9/2011 | Hamner et al. |
| 8,535,090 | B2 | | 9/2013 | Su et al. |
| 8,864,516 | B2 | | 10/2014 | Herring et al. |
| 9,142,927 | B2 | | 9/2015 | Tseng |
| 9,203,171 | B2 | | 12/2015 | Yu et al. |
| 9,450,344 | B2 | | 9/2016 | Cartier, Jr. et al. |
| 9,509,101 | B2 | | 11/2016 | Cartier, Jr. et al. |
| 9,583,906 | B2 | * | 2/2017 | Cloer .................. H01R 43/205 |
| 9,705,258 | B2 | | 7/2017 | Phillips et al. |
| 9,900,101 | B2 | | 2/2018 | Leigh et al. |
| 10,135,211 | B2 | | 11/2018 | Lloyd et al. |
| 10,559,930 | B2 | | 2/2020 | Little |
| 10,680,389 | B2 | | 6/2020 | Little |
| 11,101,611 | B2 | | 8/2021 | Winey et al. |
| 11,156,787 | B2 | * | 10/2021 | Tamekuni .............. G02B 6/406 |
| 11,158,985 | B1 | | 10/2021 | Sumida |
| 11,169,340 | B2 | | 11/2021 | Little |
| 11,177,614 | B2 | | 11/2021 | Guetig et al. |
| 11,245,231 | B2 | | 2/2022 | Hamner et al. |
| 11,437,762 | B2 | | 9/2022 | Manter et al. |
| 11,522,310 | B2 | | 12/2022 | Cohen |
| 11,735,852 | B2 | | 8/2023 | Cartier, Jr. et al. |
| 12,095,217 | B2 | * | 9/2024 | Tsorng .................. H05K 3/301 |
| 12,166,302 | B2 | | 12/2024 | Blackburn et al. |
| 2020/0244025 | A1 | * | 7/2020 | Winey .................. H01R 43/26 |
| 2023/0012133 | A1 | * | 1/2023 | Long .................... H05K 7/026 |
| 2023/0017428 | A1 | | 1/2023 | Long |

\* cited by examiner

METHOD OF USING AN ORGANIZER FOR MANUFACTURE OF ELECTRONIC DEVICE WITH CABLED INTERCONNECTS

CROSS-REFERENCE TO RELATED APPLICATIONS

This application claims priority to and the benefit under 35 U.S.C. § 119(e) of U.S. Provisional Patent Application Ser. No. 63/220,104, filed on Jul. 9, 2021, entitled "METHOD AND APPARATUS FOR EFFICIENT MANUFACTURE OF HIGH PERFORMANCE ELECTRONIC DEVICE WITH CABLED INTERCONNECTS," which is hereby incorporated herein by reference in its entirety.

FIELD

This patent application relates generally to electronic devices, such as those including cabled interconnects for high performance.

BACKGROUND

Electronic systems are assembled from multiple components that are interconnected. Often, components are mounted to printed circuit boards (PCBs), which provide both mechanical support for the components and conductive structures that deliver power to the components and provide signal paths between components attached to the PCB.

Sometimes PCBs are joined together with electrical connectors. The connectors provide a separable interface such that the PCBs in a system can be manufactured at different times or in different locations, yet simply assembled into a system. A known arrangement for joining several printed circuit boards is to have one printed circuit board serve as a backplane. Other printed circuit boards, called "daughterboards" or "daughtercards," may be connected through the backplane.

Connectors may also be used in other configurations for interconnecting printed circuit boards. Sometimes, one or more smaller printed circuit boards may be connected directly to another larger printed circuit board. In such a configuration, the larger printed circuit board may be called a "motherboard" and the printed circuit boards connected to it may be called daughterboards. In some systems, for example, the daughter boards are mounted with edges facing an edge of the motherboard. When the daughterboards are orthogonal to the motherboard, the system may be described as having a direct mate orthogonal configuration, and direct mate orthogonal connectors are designed to support this configuration. Alternatively, boards may sometimes be aligned in parallel. Connectors used to connect boards in this configuration are often called "stacking connectors" or "mezzanine connectors."

In some scenarios, components may be separated by a longer distance than can be connected via traces in a PCB. Cables may be used to route signals between components because cables can be routed through curving paths where it would be difficult to install a rigid PCB or can be manufactured with less signal loss per inch than a PCB.

Cables provide signal paths with high signal integrity, particularly for high frequency signals, such as those above 40 Gbps using an NRZ protocol. Each cable has one or more signal conductors, which is surrounded by a dielectric material, which in turn is surrounded by a conductive layer. A protective jacket, often made of plastic, may surround these components. Additionally the jacket or other portions of the cable may include fibers or other structures for mechanical support.

One type of cable, referred to as a "twinax cable," is constructed to support transmission of a differential signal and has a balanced pair of signal wires, is embedded in a dielectric, and encircled by a conductive layer. The conductive layer is usually formed using foil, such as aluminized Mylar. The twinax cable can also have a drain wire. Unlike a signal wire, which is generally surrounded by a dielectric, the drain wire may be uncoated so that it contacts the conductive layer at multiple points over the length of the cable.

Cables may be terminated with connectors, forming a cable assembly. The connectors may plug into mating connectors that are in turn connected to the components to be connected. At an end of the cable, where the cable is to be terminated to a connector or other terminating structure, the protective jacket, the dielectric and the foil may be removed, leaving portions of the signal wires and the drain wire exposed at the end of the cable. These wires may be attached to a connector or other terminating structure. The signal wires may be attached to conductive elements serving as mating contacts in the connector. The drain wire may be attached to a ground conductor in the terminating structure. In this way, any ground return path may be continued from the cable to the terminating structure.

To receive the connector of a cable assembly, a connector called an "I/O connector" may be mounted to a PCB, usually at an edge of the PCB. That connector may be configured to receive a plug at one end of a cable assembly, such that the cable is connected to the PCB through the I/O connector. The other end of the cable assembly may be connected to another electronic device.

Cables have also been used to make connections within the same electronic device. For example, cables have been used to route signals from an I/O connector to a processor assembly that is located at the interior of the PCB, away from the edge at which the I/O connector is mounted. In other configurations, both ends of a cable may be connected to the same PCB. The cables can be used to carry signals between components mounted to the PCB near where each end of the cable connects to the PCB. Within some electronic devices, cables may provide high performance interconnects, as cables may carry high speed signals over longer distances, with less attenuation and less introduced noise than printed circuit boards.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
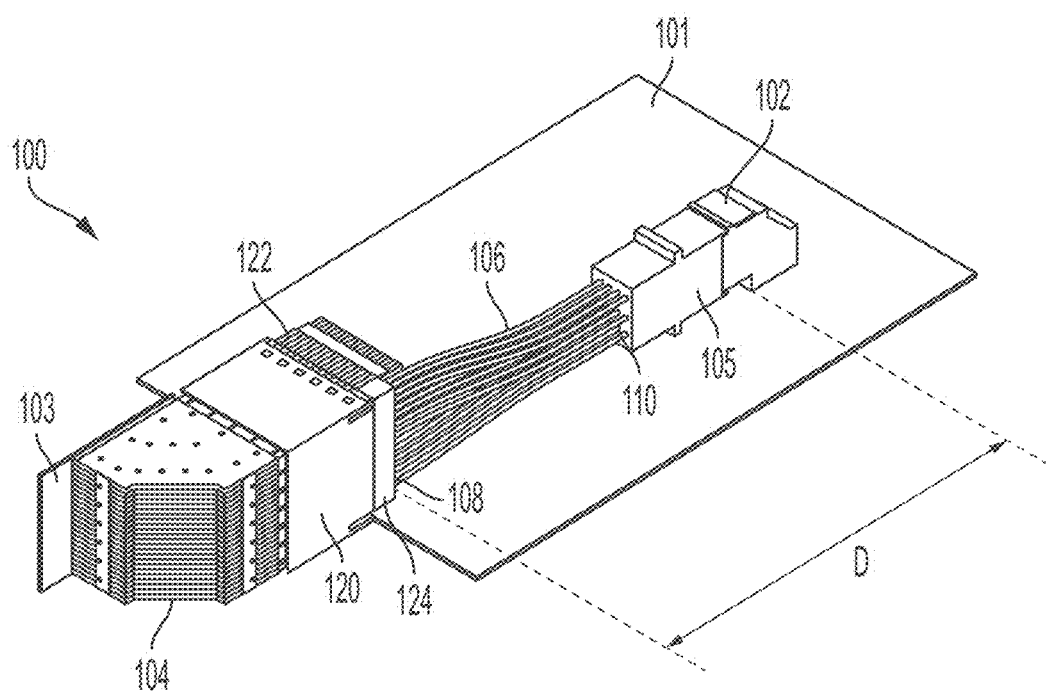
FIG. 1 is an isometric view of an illustrative electrical interconnection system, according to some embodiments.

The inventors have recognized and appreciated techniques for efficient manufacture of electronic devices that deliver higher performance through the use of cabled interconnects. A subassembly providing multiple high performance interconnects may be efficiently coupled to a substrate, enabling efficient manufacture of a device integrating the substrate and the high performance interconnects. The substrate, for example, may be a printed circuit board to which one or more high performance electronic components, such as a processor or an ASIC, is mounted. The cable interconnect subassembly may provide cabled interconnects between locations on the substrate near the high performance components and other locations in the device.

The high performance interconnects of the cable interconnect subassembly may collectively provide some or all of the high performance interconnections within the system, including those interconnects used for carrying high frequency signals over relatively long distances. Each cabled interconnect may be provided by a cable that is terminated at one end by a first connector configured for mounting to the substrate. The first connector may be configured for mounting to the substrate as a result of a force on the connector in a direction toward a surface of the substrate. The first connector, for example, may be a press fit or pressure mount connector.

A second end of each cable may be terminated with a second connector, providing a separable interface at each end of the cable. Connectors at the second end may have mating interfaces configured for making connections to other components in the system. The second connector, for example, may be an I/O connector, a direct mate orthogonal connector, or a backplane connector. Different configurations of the second connector may enable connections to different types of components, such as to a plug terminating an optical fiber, a daughter board, or a backplane. In some embodiments, all the cabled connections may be terminated at the first end by connectors of the same, first type. Alternatively or additionally, all the cabled connections may be terminated at the second end by connectors of the same, second type, which may be different than the first type. However, in other embodiments, subsets of the cabled interconnects may have a mix of different types of connectors at the first and/or second ends.

The cable interconnect subassembly may include, in addition to the cabled interconnects, a support. The support may hold the cables and may provide mechanical support for some or all the connectors terminating the first and/or second ends of the cables. The connectors at the second ends of the cables, for example, may be affixed to the support, such as with bolts or other mounting hardware. Those connectors, for example, may be positioned in an array, which may be a linear array, for making connections with a backplane or with multiple PCBs mounted orthogonal to the substrate or for fitting within openings of a panel of the electronic device.

In some embodiments, the connectors at the first ends of the cables may be movable with at least one degree of freedom relative to the support. Movement of the connectors may aid in efficient assembly of the electronic device, as movement may enable the connectors to be moved into a position where they are attached to the substrate, wholly or partially independent of the position of the support. As a result, the support may be attached to the substrate and then the connectors may be moved into engagement with the substrate.

A cabled interconnect subassembly enables the cabled interconnects to be formed separately from the substrate. The skills and equipment required to manufacture high performance cabled interconnects are different than those required to manufacture a substrate, such as a printed circuit board loaded with high performance components. The cabled interconnect subassembly enables each portion—the subassembly and the substrate—to be manufactured in the most efficient and reliable way and then simply joined. Different entities may manufacture the subassembly and the substrate for example, taking advantage of the skills and equipment available to each.

Enabling relative movement of the connectors and the substrate enables reliable connections between the cables and the substrate when the subassembly and substrate are joined, absent which the electronic device might not perform reliably. For example, the support may be joined to the substrate with a fixed connection, such as might be provided by bolts or other fasteners that are intended to provide a connection that is maintained throughout the normal operating life of the device. The connectors may thereafter be moved into engagement with the substrate.

In some embodiments, the subassembly may include a surface that can be aligned with a surface of the substrate to which the connectors are to be mounted. The surface of the subassembly may include positioning features that engage complementary positioning features on the surface of the substrate to establish the position of the surface of the subassembly relative to the surface of the substrate to which the connectors at the first ends of the cables are to be attached. These positioning features may be, for example, posts extending from the surface of the subassembly to engage holes in the substrate, or vice versa.

The connectors may be held in the subassembly in a predetermined position relative to the positioning features of the subassembly. That predetermined position may be the same as the relative position between the locations on the substrate at which the connectors are to be mounted and the positioning features of the substrate. As a result, when the positioning features of the subassembly and the substrate are engaged, the connectors may be aligned with the locations on the substrate at which they are to be attached.

In some embodiments, the connectors terminating the first ends of the cables may be held to the substrate in a way that establishes the position of the connectors, in a plane parallel to a surface of the subassembly, relative to the positioning features of the subassembly. The connectors may be movable in a direction perpendicular to that plane. When the subassembly is coupled to the substrate with that surface of the subassembly resting on or otherwise parallel to the surface of the substrate, the connectors are aligned with the attachment locations on the substrate. For example, the subassembly may have openings that extend through the surface of the subassembly. The connectors may be inserted into the openings, which may be sized to allow the connectors to move within the openings. With the surface of the subassembly aligned with the surface of the substrate, the connectors may be moved within the openings in a direction normal to the surface of the substrate to attach the connectors to the desired locations of the substrate.

In some embodiments, the connectors at the first ends of the cables may be releasably held to one or more other components of the subassembly. A releasable connection enables efficient and reliable manufacture of the electronic device. The subassembly may be manufactured and then transported to a location where it is joined to the substrate. The subassembly may be positioned relative to the substrate with the connectors in predetermined positions. The connectors may then be released and engaged to the substrate, completing multiple high performance cabled interconnects between the substrate and other locations within the electronic device. In some embodiments, the releasable connection may be formed with a latch. Latching members on the connectors and on the subassembly may engage to hold the connectors in a desired position until the latch is released.

A tool may be used release the connectors at the first ends of the cables and/or press them toward the substrate for attaching the connectors to the substrate. In some embodiments, the subassembly and the tool may be configured such that a single tool may be used to both release the connectors from the subassembly and attach them to the substrate. One or more tools may be provided as part of a kit, including the subassembly, in some embodiments.

The subassembly may include one or more organizers for a group of connectors to be attached to the substrate. The organizer may include one or more structures that position connectors of the group in predetermined positions relative to each other in a plane. A component of the subassembly with openings in a surface receiving the connectors, as described above, may serve as an organizer. That component may be a portion of a support in the subassembly. Alternatively or additionally, the organizer may be a component separate from the support of the subassembly. The organizer, for example, may be a tray, container, or other component configured to position one or more connectors with a predetermined relative position.

An organizer may have openings into which connectors may be inserted such that the connectors are positioned by the openings. Alternatively or additionally, an organizer may have one or more protrusions or other structures that engage with the one or more connectors to set the position of the connectors in at least two dimensions.

In embodiments in which the organizer is a component separate from the support for the subassembly, the organizer may be movable with at least one degree of freedom relative to the support. In some embodiments, the organizer may be movable relative to the support with at least two degrees of freedom. The organizer may be movable relative to the support, such that the organizer can be moved in a plane parallel to the surface of the substrate and aligned with a desired location on the surface of the substrate. The organizer may be coupled to the support through one or more joints or linkages so as to enable relative movement of the organizer and the support. For example, the organizer may be coupled to the support via the cables terminated to the connectors held in the organizer and/or through one or more members, such as a polymer jacket or fiber reinforced sheath around a bundle of cables terminated to a connector.

Such a configuration enables an efficient method of manufacture for an electronic device with cabled interconnects. The cabled interconnect subassembly may be manufactured separately from the substrate. The subassembly may include cabled interconnects with a first plurality of connectors, configured for mounting to a substrate, terminating first ends of the cables. The second ends of the cables may be terminated to a second plurality of connectors, which may be attached to the support for the subassembly. The first plurality of connectors may be held to the organizer, and the cables my be held in desired locations with clips attached to the support.

The substrate and the subassembly, populated with high performance components, may then be brought together. The support of the subassembly may be attached to the substrate. In embodiments in which the organizer is movable with respect to the support, the organizer may be moved into a position relative to the substrate that positions the first plurality of connectors to align with mounting locations for those connectors on the surface of the substrate. With the organizer positioning the first plurality of connectors in the desired location, the connectors may be released from the organizer and attached to the substrate.

The first plurality of connectors may be miniaturized to support a large number of connections required for many high performance electronic devices. The mounting locations for such miniaturized connectors may also be miniaturized. A connector footprint for a pressure mount connector, for example, may have pads that are less than 0.5 mm wide. Making reliable connections with such miniaturized connectors may require positioning the connector relative to the substrate with a precision of a fraction of a millimeter. A subassembly as described herein may enable such accurate positioning.

In embodiments in which the organizer is movable with respect to the support for the cable interconnect subassembly, the support may be easily attached to the substrate with relatively low precision, which may be achieved with a low cost manufacturing operation. The organizer may be positioned with greater precision. In some embodiments, the organizer may include alignment features that aid in precise alignment of the organizer and the surface of the substrate with mounting locations for the connectors in the organizer. The organizer, for example, may include alignment features that engage with complementary alignment features on the substrate. In this way, the first plurality of connectors may be reliably aligned with a low cost manufacturing operation.

In some embodiments, the substrate may be large. For example, connectors connecting cabled interconnects to the substrate may be mounted to the substrate along an edge of the substrate such that the furthest mounting locations are separated by a large distance, such as 18 inches or more. The required precision in the manufacture and positioning of the organizer necessary to ensure that all connectors held by the organizer are properly aligned may be reduced by manufacturing the organizer as multiple independently movable components. Each component may itself be an organizer, positioning a subset of the first plurality of connectors for attachment to the substrate. Such a design may further contribute to efficient and reliable manufacture of an electronic device.

Turning to the figures, exemplary embodiments of an electronic device, and a method of manufacture of such a device, are illustrated. FIG. 1 illustrates a portion of an electronic device in which multiple cabled interconnects are used to form multiple high performance interconnects. In this example, a relatively small number of cabled interconnects are used, and the cabled interconnects are formed without a cabled interconnect subassembly as described above.

FIG. 1, nonetheless, illustrates cabled interconnects made with cables with connectors attached at a first end to make connections to a substrate, such as a printed circuit board. The cables in those cabled interconnects may have connectors at their second ends to make a separable connection to other portions of an electronic system. It should be understood that a larger and more complicated electronic device may have more cabled interconnects than are illustrated in FIG. 1.

As shown, connector 102 is attached to a substrate, here illustrated as printed circuit board (PCB) 101. A second connector, connector 120, is attached to an edge of PCB 101. Cables 106 are terminated at a first end to a connector 105 that mates with connector 102. Cables 106 are terminated at a second end to connector 120. In this example, connector 120 is configured to make connections both through a PCB, such as PCB 101, and through cables, such as cables 106. However, connector 120 is a modular connector that may be assembled in any of multiple configurations, including configurations in which all connections are made through a PCB or all connections are made through cables.

In FIG. 1, electrical interconnection system 100 includes connectors 102, 104, 120, cables 106, and printed circuit boards (PCBs) 101, 103. Connector 120 may include first type connector units 122 and second type connector units 124. The first type connector units may be directly mounted to PCB 101. The second type connector units may be coupled to PCB 101 through cables 106. In the embodiment illustrated, cables 106 connect to connector 102, which in turn makes connections to PCB 101.

In the illustrated example, connector 120 includes both signal conductors configured to attach to a printed circuit board and to attach to a cable. Connector 120 may be assembled from connector units that are configured for each type of attachment, such that there is a first type of connector units that have signal conductors configured to attach to a printed circuit board and a second type of connector units that have signal conductors configured to attach to a cable. However, the present invention is not limited in this regard. In some embodiments, cables may be terminated to other types of connectors or to conductors that are part of other types of electronic components.

Connector 104 may be mounted to PCB 103 at one end and mate with connector 120 on the other end such that PCB 103 is orthogonal to PCB 101.

Cables 106 may have first ends 108 attached to the second type connector units 124 and second ends 110 attached to connector 105. Connector 105 is here mated to connector 102, through which signals carried by the cables are coupled to PCB 101. The second ends of the cables may be coupled to PCB 101 at a location spaced from the first ends of the cables with a distance D. Any suitable value may be selected for the distance D. In some embodiments, D may be at least 6 inches, in the range of 1 to 20 inches, or any value within the range, such as between 6 and 20 inches. However, the upper limit of the range may depend on the size of PCB 101, and the distance from connector 120 that components (not shown) are mounted to PCB 101, as connector 102 may be mounted near components that receive or generate signals that pass through cables 106. As a specific example, connector 102 may be mounted within 6 inches of those components, and in some embodiments, will be mounted within 4 inches of those components or within 2 inches of those components.

Connector 120 may be mated to any suitable type of connector. In some embodiments, mating connector 104 may be an orthogonal connector. In the illustrated embodiments, both connectors 120 and 104 may have a modular construction, and similar modules may be used for corresponding components. Connector 104 may be configured similarly to connector 200 illustrated in FIG. 2. In such an embodiment, connector 120 may be configured as a direct attach orthogonal connector. That configuration may be achieved by attaching an extender, as described below, to a connector with a mating interface that is the same as the mating interface described in connection with connector 200.

Figure 2:
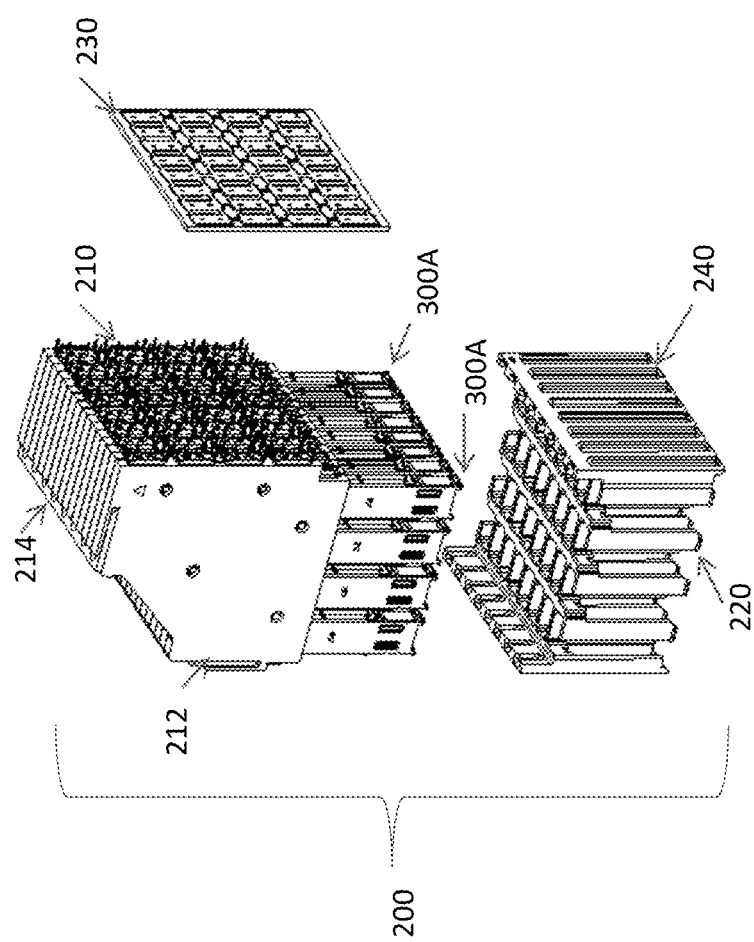
FIG. 2 is an isometric view, partially exploded, of a modular connector, configured as the right angle connector of FIG. 1, according to some embodiments.

As can be seen in FIG. 2, connector 200 includes contact tails 210 designed to attach to a PCB. These contact tails form one end of conductive elements that pass through the interconnection system. When the connectors are mounted to printed circuit boards, these contact tails will make electrical connection to conductive structures within the printed circuit board that carry signals or are connected to a reference potential. In the example illustrated, the contact tails are press fit, "eye of the needle," contacts that are designed to be pressed into vias in a printed circuit board. However, other forms of contact tails may be used.

Each of the connectors also has a mating interface where that connector can mate—or be separated from—the other connector. Connector 200 includes a mating interface 220. Though not fully visible in the view shown in FIG. 2, mating contact portions of the conductive elements are exposed at the mating interface.

Each of these conductive elements includes an intermediate portion that connects a contact tail to a mating contact portion. The intermediate portions may be held within a connector housing, at least a portion of which may be dielectric so as to provide electrical isolation between conductive elements. Additionally, the connector housings may include conductive or lossy portions, which in some embodiments may provide conductive or partially conductive paths between some of the conductive elements. In some embodiments, the conductive portions may provide shielding. The lossy portions may also provide shielding in some instances and/or may provide desirable electrical properties within the connectors.

In various embodiments, dielectric members may be molded or over-molded from a dielectric material such as plastic or nylon. Examples of suitable materials include, but are not limited to, liquid crystal polymer (LCP), polyphenyline sulfide (PPS), high temperature nylon or polyphenylenoxide (PPO) or polypropylene (PP). Other suitable materials may be employed, as aspects of the present disclosure are not limited in this regard.

All of the above-described materials are suitable for use as binder material in manufacturing connectors. In accordance with some embodiments, one or more fillers may be included in some or all of the binder material. As a non-limiting example, thermoplastic PPS filled to 30% by volume with glass fiber may be used to form the entire connector housing or dielectric portions of the housings.

Alternatively or additionally, portions of the housings may be formed of conductive materials, such as machined metal or pressed metal powder. In some embodiments, portions of the housing may be formed of metal or other conductive material with dielectric members spacing signal conductors from the conductive portions. For example, a housing of a connector may have regions formed of a conductive material with insulative members separating the intermediate portions of signal conductors from the conductive portions of the housing.

The housing of connector 200 may also be formed in any suitable way. In the embodiment illustrated, daughtercard connector 200 may be formed from multiple units, which may be subassemblies, which may include one or more "wafers" and, in some embodiments, one or more extender modules, and one or more support members to hold the components together. Each of the wafers (300, FIG. 3) may include a housing portion, which may similarly include dielectric, lossy and/or conductive portions. One or more members may hold the wafers in a desired position. For example, support members 212 and 214 may hold top and rear portions, respectively, of multiple wafers in a side-by-side configuration. Support members 212 and 214 may be formed of any suitable material, such as a sheet of metal stamped with tabs, openings or other features that engage corresponding features on the individual wafers.

Other members that may form a portion of the connector housing may provide mechanical integrity for daughtercard connector 200 and/or hold the wafers in a desired position. For example, a front housing portion 240 (FIG. 2) may receive portions of the wafers forming the mating interface. Any or all of these portions of the connector housing may be dielectric, lossy and/or conductive, to achieve desired electrical properties for the interconnection system.

In some embodiments, each wafer may hold a column of conductive elements forming signal conductors. These signal conductors may be shaped and spaced to form single ended signal conductors. However, in the embodiment illustrated in FIG. 1, the signal conductors are shaped and spaced in pairs to provide differential signal conductors. Each of the columns may include or be bounded by conductive elements serving as ground conductors. It should be appreciated that ground conductors need not be connected to earth ground, but are shaped to carry reference potentials, which may include earth ground, DC voltages or other suitable reference potentials. The "ground" or "reference" conductors may have a shape different than the signal conductors, which are configured to provide suitable signal transmission properties for high frequency signals.

Conductive elements may be made of metal or any other material that is conductive and provides suitable mechanical properties for conductive elements in an electrical connector. Phosphor-bronze, beryllium copper and other copper alloys are non-limiting examples of materials that may be used. The conductive elements may be formed from such materials in any suitable way, including by stamping and/or forming.

The spacing between adjacent columns of conductors may be within a range that provides a desirable density and desirable signal integrity. As a non-limiting example, the conductors may be stamped from 0.4 mm thick copper alloy, and the conductors within each column may be spaced apart by 2.25 mm and the columns of conductors may be spaced apart by 2.4 mm. However, a higher density may be achieved by placing the conductors closer together. In other embodiments, for example, smaller dimensions may be used to provide higher density, such as a thickness between 0.2 and 0.4 mm or spacing of 0.7 to 1.85 mm between columns or between conductors within a column. Moreover, each column may include four pairs of signal conductors, such that a density of 60 or more pairs per linear inch is achieved for the interconnection system illustrated in FIG. 1. However, it should be appreciated that more pairs per column, tighter spacing between pairs within the column and/or smaller distances between columns may be used to achieve a higher density connector.

The wafers may be formed in any suitable way. In some embodiments, the wafers may be formed by stamping columns of conductive elements from a sheet of metal and over molding dielectric portions on the intermediate portions of the conductive elements. In other embodiments, wafers may be assembled from modules each of which includes a single, single-ended signal conductor, a single pair of differential signal conductors or any suitable number of single ended or differential pairs.

The inventors have recognized and appreciated that assembling wafers from modules may aid in reducing "skew" in signal pairs at higher frequencies, such as between about 25 GHz and 40 GHz, or higher. Skew, in this context, refers to the difference in electrical propagation time between signals of a pair that operates as a differential signal. Modular construction that reduces skew is described, for example in U.S. Pat. Nos. 9,509,101 and 9,450,344, which are incorporated herein by reference.

In accordance with techniques described in those patents incorporated by reference, in some embodiments, connectors may be formed of modules, each carrying a signal pair. The modules may be individually shielded, such as by attaching shield members to the modules and/or inserting the modules into an organizer or other structure that may provide electrical shielding between pairs and/or ground structures around the conductive elements carrying signals.

In some embodiments, signal conductor pairs within each module may be broadside coupled over substantial portions of their lengths. Broadside coupling enables the signal conductors in a pair to have the same physical length. To facilitate routing of signal traces within the connector footprint of a printed circuit board to which a connector is attached and/or constructing of mating interfaces of the connectors, the signal conductors may be aligned with edge-to-edge coupling in one or both of these regions. As a result, the signal conductors may include transition regions in which coupling changes from edge-to-edge to broadside or vice versa. As described below, these transition regions may be designed to prevent mode conversion or suppress undesired propagation modes that can interfere with signal integrity of the interconnection system.

The modules may be assembled into wafers or other connector structures. In some embodiments, a different module may be formed for each row position at which a pair is to be assembled into a right angle connector. These modules may be made to be used together to build up a connector with as many rows as desired. For example, a module of one shape may be formed for a pair to be positioned at the shortest rows of the connector, sometimes called the a-b rows. A separate module may be formed for conductive elements in the next longest rows, sometimes called the c-d rows. The inner portion of the module with the c-d rows may be designed to conform to the outer portion of the module with the a-b rows.

Figure 4:
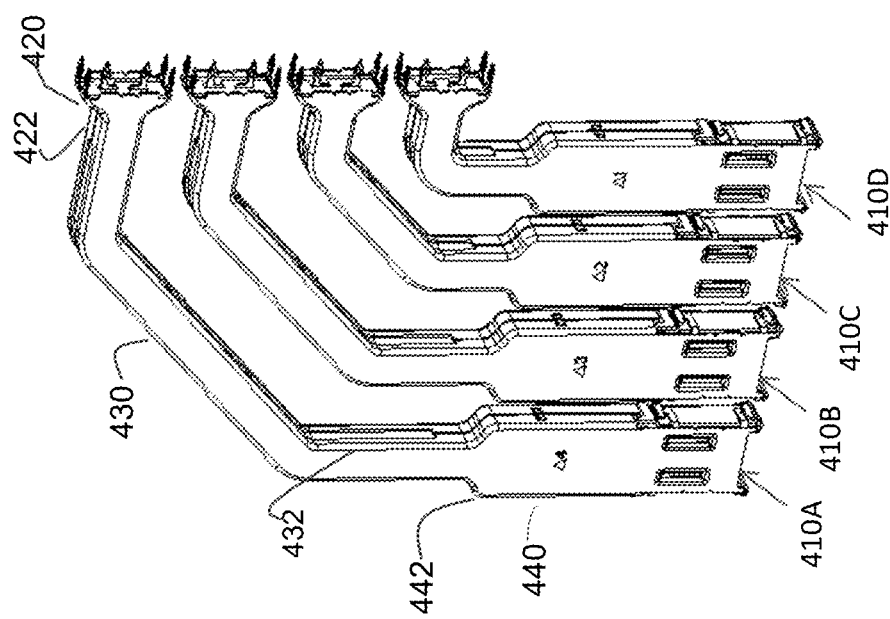
FIG. 4 is an isometric view of wafer modules of the wafer assembly of FIG. 3, according to some embodiments.

This pattern may be repeated for any number of pairs. Each module may be shaped to be used with modules that carry pairs for shorter and/or longer rows. To make a connector of any suitable size, a connector manufacturer may assemble into a wafer a number of modules to provide a desired number of pairs in the wafer. In this way, a connector manufacturer may introduce a connector family for a widely used connector size—such as 2 pairs. As customer requirements change, the connector manufacturer may procure tools for each additional pair, or, for modules that contain multiple pairs, group of pairs to produce connectors of larger sizes. The tooling used to produce modules for smaller connectors can be used to produce modules for the shorter rows even of the larger connectors. Such a modular connector is illustrated in FIG. 4.

Turning to FIG. 2, further details of connector 200 are shown in a partially exploded view. Components as illustrated in FIG. 2 may be assembled into a connector, configured to mate with a backplane connector as described above. Alternatively or additionally, a subset of the connector components shown in FIG. 2 may be assembled, in combination with other components, to form an orthogonal connector. Such an orthogonal connector may mate with a connector as shown in FIG. 2.

As shown, connector 200 includes multiple wafers 300A held together in a side-by-side configuration. Here, eight wafers are shown. However, the size of the connector assembly may be configured by incorporating more rows per wafer, more wafers per connector, or more connectors per interconnection system.

Conductive elements within the wafers 300A may include mating contact portions and contact tails. Contact tails 210 are shown extending from a surface of connector 200 adapted for mounting against a printed circuit board. In some embodiments, contact tails 210 may pass through a member 230. Member 230 may include insulative, lossy and/or conductive portions. In some embodiments, contact tails associated with signal conductors may pass through insulative portions of member 230. Contact tails associated with reference conductors may pass through lossy or conductive portions.

In some embodiments, the conductive or lossy portions may be compliant, such as may result from a conductive elastomer or other material that may be known in the art for forming a gasket. The compliant material may be thicker than the insulative portions of member 230. Such compliant material may be positioned to align with pads on a surface of a daughtercard to which connector 200 is to be attached. Those pads may be connected to reference structures within the printed circuit board such that, when connector 200 is attached to the printed circuit board, the compliant material makes contact with the pads on the surface of the printed circuit board, and the contact tails are connected to the reference structures within the printed circuit board.

The conductive or lossy portions of member 230 may be positioned to make electrical connection to reference conductors within connector 200. Such connections may be formed, for example, by contact tails of the reference conductors passing through the lossy or conductive portions. Alternatively or additionally, in embodiments in which the lossy or conductive portions are compliant, those portions may be positioned to press against the mating reference conductors when the connector is attached to a printed circuit board.

Mating contact portions of the wafers 300A are held in a front housing portion 240. The front housing portion may be made of any suitable material, which may be insulative, lossy and/or conductive or may include any suitable combination of such materials. For example, the front housing portion may be molded from a filled, lossy material or may be formed from a conductive material, using materials and techniques similar to those described above for the housing walls 226. As shown, the wafers are assembled from modules 410A, 410B, 410C and 410D (FIG. 4), each with a pair of signal conductors surrounded by reference conductors. In the embodiment illustrated, front housing portion 240 has multiple passages, each positioned to receive one such pair of signal conductors and associated reference conductors. However, it should be appreciated that each module might contain a single signal conductor or more than two signal conductors.

Front housing 240, in the embodiment illustrated, is shaped to fit within walls of a connector. However, in some embodiments, as described in more detail below, the front housing may be configured to connect to an extender shell.

Figure 3:
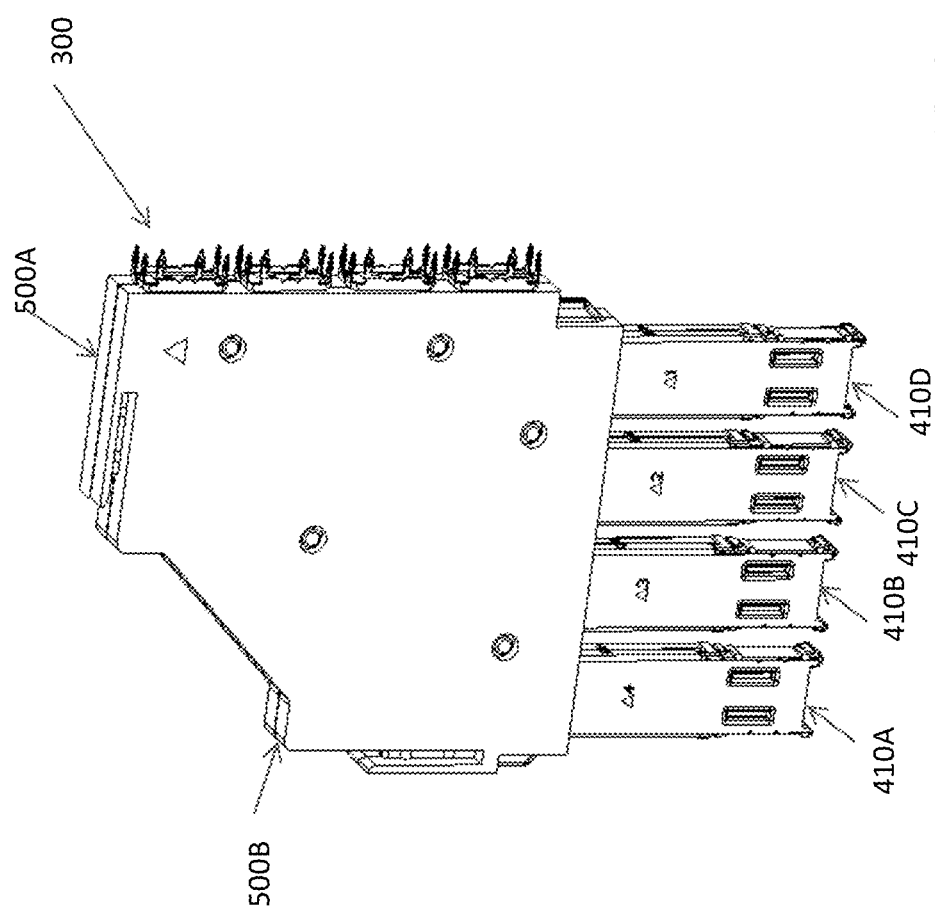
FIG. 3 is an isometric view of a wafer assembly of the connector of FIG. 2, according to some embodiments.

FIG. 3 illustrates a wafer 300. Multiple such wafers may be aligned side-by-side and held together with one or more support members, or in any other suitable way, to form a connector or, as described below, an orthogonal connector. In the embodiment illustrated, wafer 300 is a subassembly formed from multiple modules 410A, 410B, 410C and 410D. The modules are aligned to form a column of mating contact portions along one edge of wafer 300 and a column of contact tails along another edge of wafer 300. In the embodiment in which the wafer is designed for use in a right angle connector, as illustrated, those edges are perpendicular.

In the embodiment illustrated, each of the modules includes reference conductors that at least partially enclose the signal conductors. The reference conductors may similarly have mating contact portions and contact tails.

The modules may be held together in any suitable way. For example, the modules may be held within a housing, which in the embodiment illustrated is formed with members 500A and 500B. Members 500A and 500B may be formed separately and then secured together, capturing modules 410A . . . 410D between them. Members 500A and 500B may be held together in any suitable way, such as by attachment members that form an interference fit or a snap fit. Alternatively or additionally, adhesive, welding or other attachment techniques may be used.

Members 500A and 500B may be formed of any suitable material. That material may be an insulative material. Alternatively or additionally, that material may be or may include portions that are lossy or conductive. Members 500A and 500B may be formed, for example, by molding such materials into a desired shape. Alternatively, members 500A and 500B may be formed in place around modules 410A . . . 410D, such as via an insert molding operation. In such an embodiment, it is not necessary that members 500A and 500B be formed separately. Rather, a housing portion to hold modules 410A . . . 410D may be formed in one operation.

FIG. 4 shows modules 410A . . . 410D without members 500A and 500B. In this view, the reference conductors are visible. Signal conductors (not visible in FIG. 4) are enclosed within the reference conductors, forming a waveguide structure. Each waveguide structure includes a contact tail region 420, an intermediate region 430 and a mating contact region 440. Within the mating contact region 440 and the contact tail region 420, the signal conductors are positioned edge to edge. Within the intermediate region 430, the signal conductors are positioned for broadside coupling. Transition regions 422 and 442 are provided to transition between the edge coupled orientation and the broadside coupled orientation.

The transition regions 422 and 442 in the reference conductors may correspond to transition regions in signal conductors, as described below. In the illustrated embodiment, reference conductors form an enclosure around the signal conductors. A transition region in the reference conductors, in some embodiments, may keep the spacing between the signal conductors and reference conductors generally uniform over the length of the signal conductors. Thus, the enclosure formed by the reference conductors may have different widths in different regions.

The reference conductors provide shielding coverage along the length of the signal conductors. As shown, coverage is provided over substantially all of the length of the signal conductors, including coverage in the mating contact portion and the intermediate portions of the signal conductors. The contact tails are shown exposed so that they can make contact with the printed circuit board. However, in use, mating contact portions will be adjacent ground structures within a printed circuit board such that being exposed as shown in FIG. 4 does not detract from shielding coverage along substantially all of the length of the signal conductor. In some embodiments, mating contact portions might also be exposed for mating to another connector. Accordingly, in some embodiments, shielding coverage may be provided over more than 80%, 85%, 90% or 95% of the intermediate portion of the signal conductors. Similarly, shielding coverage may also be provided in the transition regions, such that shielding coverage may be provided over more than 80%, 85%, 90% or 95% of the combined length of the intermediate portion and transition regions of the signal conductors. In some embodiments, as illustrated, the mating contact regions and some or all of the contact tails may also be shielded, such that shielding coverage may be, in various embodiments, over more than 80%, 85%, 90% or 95% of the length of the signal conductors.

In the embodiment illustrated, a waveguide-like structure formed by the reference conductors has a wider dimension in the column direction of the connector in the contact tail regions 420 and the mating contact region 440 to accommodate for the wider dimension of the signal conductors being side-by-side in the column direction in these regions. In the embodiment illustrated, contact tail regions 420 and the mating contact region 440 of the signal conductors are separated by a distance that aligns them with the mating contacts of a mating connector or contact structures on a printed circuit board to which the connector is to be attached.

These spacing requirements mean that the waveguide will be wider in the column dimension than it is in the transverse direction, providing an aspect ratio of the waveguide in these regions that may be at least 2:1, and in some embodiments may be on the order of at least 3:1. Conversely, in the intermediate region 430, the signal conductors are oriented with the wide dimension of the signal conductors overlaid in the column dimension, leading to an aspect ratio of the waveguide that may be less than 2:1, and in some embodiments may be less than 1.5:1 or on the order of 1:1.

With this smaller aspect ratio, the largest dimension of the waveguide in the intermediate region 430 will be smaller than the largest dimension of the waveguide in regions 420 and 440. Because the lowest frequency propagated by a waveguide is inversely proportional to the length of its shortest dimension, the lowest frequency mode of propagation that can be excited in intermediate region 430 is higher than can be excited in contact tail regions 420 and the mating contact region 440. The lowest frequency mode that can be excited in the transition regions will be intermediate between the two. Because the transition from edge coupled to broadside coupling has the potential to excite undesired modes in the waveguides, signal integrity may be improved if these modes are at higher frequencies than the intended operating range of the connector, or at least are as high as possible.

These regions may be configured to avoid mode conversion upon transition between coupling orientations, which would excite propagation of undesired signals through the waveguides. For example, as shown below, the signal conductors may be shaped such that the transition occurs in the intermediate region 430 or the transition regions 422 and 442, or partially within both. Additionally or alternatively, the modules may be structured to suppress undesired modes excited in the waveguide formed by the reference conductors, as described in greater detail below.

Though the reference conductors may substantially enclose each pair, it is not a requirement that the enclosure be without openings. Accordingly, in embodiments shaped to provide rectangular shielding, the reference conductors in the intermediate regions may be aligned with at least portions of all four sides of the signal conductors. The reference conductors may combine for example to provide 360 degree coverage around the pair of signal conductors. Such coverage may be provided, for example, by overlapping or physically contacting reference conductors. In the illustrated embodiment, the reference conductors are U-shaped shells and come together to form an enclosure.

Three-hundred-and-sixty degree coverage may be provided regardless of the shape of the reference conductors. For example, such coverage may be provided with circular, elliptical or reference conductors of any other suitable shape. However, it is not a requirement that the coverage be complete. The coverage, for example, may have an angular extent in the range between about 270 and 365 degrees. In some embodiments, the coverage may be in the range of about 340 to 360 degrees. Such coverage may be achieved for example, by slots or other openings in the reference conductors.

In some embodiments, the shielding coverage may be different in different regions. In the transition regions, the shielding coverage may be greater than in the intermediate regions. In some embodiments, the shielding coverage may have an angular extent of greater than 355 degrees, or even in some embodiments 360 degrees, resulting from direct contact, or even overlap, in reference conductors in the transition regions even if less shielding coverage is provided in the transition regions.

The inventors have recognized and appreciated that, in some sense, fully enclosing a signal pair in reference conductors in the intermediate regions may create effects that undesirably impact signal integrity, particularly when used in connection with a transition between edge coupling and broadside coupling within a module. The reference conductors surrounding the signal pair may form a waveguide. Signals on the pair, and particularly within a transition region between edge coupling and broadside coupling, may cause energy from the differential mode of propagation between the edges to excite signals that can propagate within the waveguide. In accordance with some embodiments, one or more techniques to avoid exciting these undesired modes, or to suppress them if they are excited, may be used.

Some techniques that may be used increase the frequency that will excite the undesired modes. In the embodiment illustrated, the reference conductors may be shaped to leave openings 432. These openings may be in the narrower wall of the enclosure. However, in embodiments in which there is a wider wall, the openings may be in the wider wall. In the embodiment illustrated, openings 432 run parallel to the intermediate portions of the signal conductors and are between the signal conductors that form a pair. These slots lower the angular extent of the shielding, such that, adjacent the broadside coupled intermediate portions of the signal conductors, the angular extent of the shielding may be less than 360 degrees. It may, for example, be in the range of 355 of less. In embodiments in which members 500A and 500B are formed by over molding lossy material on the modules, lossy material may be allowed to fill openings 432, with or without extending into the inside of the waveguide, which may suppress propagation of undesired modes of signal propagation that can decrease signal integrity.

In the embodiment illustrated in FIG. 4, openings 432 are slot-shaped, effectively dividing the shielding in half in intermediate region 430. The lowest frequency that can be excited in a structure serving as a waveguide—as is the effect of the reference conductors that substantially surround the signal conductors as illustrated in FIG. 4—is inversely proportional to the dimensions of the sides. In some embodiments, the lowest frequency waveguide mode that can be excited is a TEM mode. Effectively shortening a side by incorporating slot-shaped opening 432, raises the frequency of the TEM mode that can be excited. A higher resonant frequency can mean that less energy within the operating frequency range of the connector is coupled into undesired propagation within the waveguide formed by the reference conductors, which improves signal integrity.

In region 430, the signal conductors of a pair are broadside coupled and the openings 432, with or without lossy material in them, may suppress TEM common modes of propagation. While not being bound by any particular theory of operation, the inventors theorize that openings 432, in combination with an edge coupled to broadside coupled transition, aid in providing a balanced connector suitable for high frequency operation.

Figure 5:
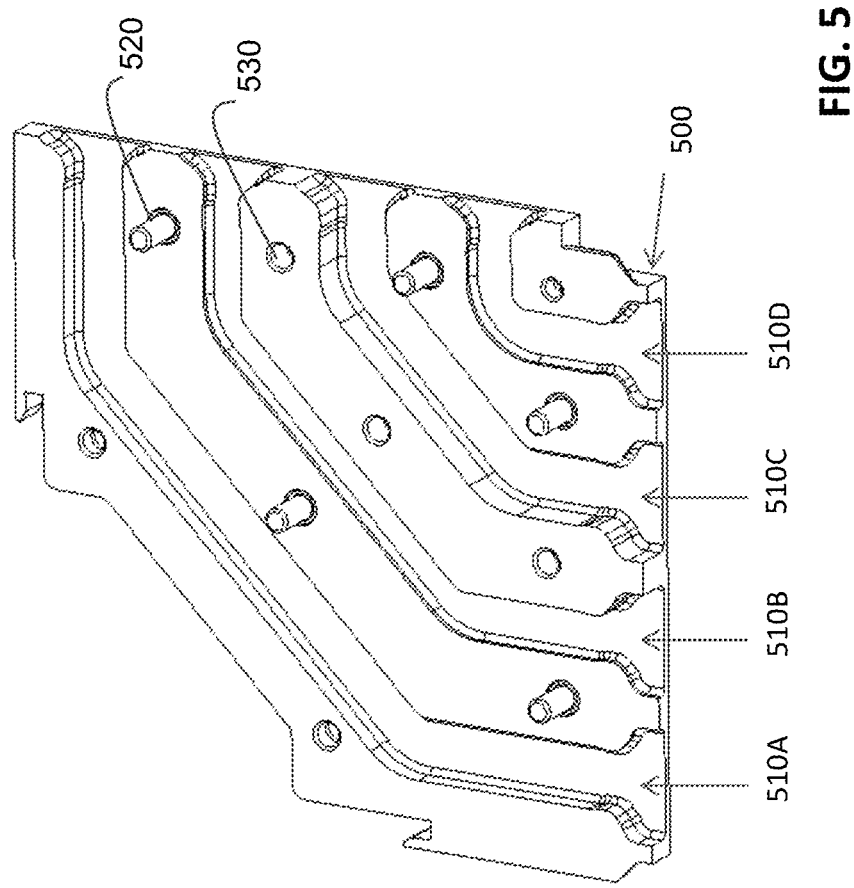
FIG. 5 is an isometric view of a portion of the insulative housing of the wafer assembly of FIG. 3, according to some embodiments.

FIG. 5 illustrates a member 500, which may be a representation of member 500A or 500B. As can be seen, member 500 is formed with channels 510A . . . 510D shaped to receive modules 410A . . . 410D shown in FIG. 4. With the modules in the channels, member 500A may be secured to member 500B. In the illustrated embodiment, attachment of members 500A and 500B may be achieved by posts, such as post 520, in one member, passing through a hole, such as hole 530, in the other member. The post may be welded or otherwise secured in the hole. However, any suitable attachment mechanism may be used.

Members 500A and 500B may be molded from or include a lossy material. Any suitable lossy material may be used for these and other structures that are "lossy." Materials that conduct, but with some loss, or material which by another physical mechanism absorbs electromagnetic energy over the frequency range of interest are referred to herein generally as "lossy" materials. Electrically lossy materials can be formed from lossy dielectric and/or poorly conductive and/or lossy magnetic materials. Magnetically lossy material can be formed, for example, from materials traditionally regarded as ferromagnetic materials, such as those that have a magnetic loss tangent greater than approximately 0.05 in the frequency range of interest. The "magnetic loss tangent" is the ratio of the imaginary part to the real part of the complex electrical permeability of the material. Practical lossy magnetic materials or mixtures containing lossy magnetic materials may also exhibit useful amounts of dielectric loss or conductive loss effects over portions of the frequency range of interest. Electrically lossy material can be formed from material traditionally regarded as dielectric materials, such as those that have an electric loss tangent greater than approximately 0.05 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain conductive particles or regions that are sufficiently dispersed that they do not provide high conductivity or otherwise are prepared with properties that lead to a relatively weak bulk conductivity compared to a good conductor such as copper over the frequency range of interest.

Electrically lossy materials typically have a bulk conductivity of about 1 Siemen/meter to about 100,000 siemens/ meter and preferably about 1 Siemen/meter to about 10,000 siemens/meter. In some embodiments material with a bulk conductivity of between about 10 siemens/meter and about 200 siemens/meter may be used. As a specific example, material with a conductivity of about 50 siemens/meter may be used. However, it should be appreciated that the conductivity of the material may be selected empirically or through electrical simulation using known simulation tools to determine a suitable conductivity that provides both a suitably low crosstalk with a suitably low signal path attenuation or insertion loss.

Electrically lossy materials may be partially conductive materials, such as those that have a surface resistivity between 1 $\Omega$/square and 100,000 $\Omega$/square. In some embodiments, the electrically lossy material has a surface resistivity between 10 $\Omega$/square and 1000 $\Omega$/square. As a specific example, the material may have a surface resistivity of between about 20 $\Omega$/square and 80 $\Omega$/square.

In some embodiments, electrically lossy material is formed by adding to a binder a filler that contains conductive particles. In such an embodiment, a lossy member may be formed by molding or otherwise shaping the binder with filler into a desired form. Examples of conductive particles that may be used as a filler to form an electrically lossy material include carbon or graphite formed as fibers, flakes, nanoparticles or other types of particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure, or can otherwise be used to position the filler material. In some embodiments, the binder may be a thermoplastic material traditionally used in the manufacture of electrical connectors to facilitate the molding of the electrically lossy material into the desired shapes and locations as part of the manufacture of the electrical connector. Examples of such materials include liquid crystal polymer (LCP) and nylon. However, many alternative forms of binder materials may be used. Curable materials, such as epoxies, may serve as a binder. Alternatively, materials such as thermosetting resins or adhesives may be used.

Also, while the above described binder materials may be used to create an electrically lossy material by forming a binder around conducting particle fillers, the application is not so limited. For example, conducting particles may be impregnated into a formed matrix material or may be coated onto a formed matrix material, such as by applying a conductive coating to a plastic component or a metal component. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Celanese Corporation which can be filled with carbon fibers or stainless steel filaments. A lossy material, such as lossy conductive carbon filled adhesive preform, such as those sold by Techfilm of Billerica, Massachusetts, US may also be used. This preform can include an epoxy binder filled with carbon fibers and/or other carbon particles. The binder surrounds carbon particles, which act as a reinforcement for the preform. Such a preform may be inserted in a connector wafer to form all or part of the housing. In some embodiments, the preform may adhere through the adhesive in the preform, which may be cured in a heat treating process. In some embodiments, the adhesive may take the form of a separate conductive or non-conductive adhesive layer. In some embodiments, the adhesive in the preform alternatively or additionally may be used to secure one or more conductive elements, such as foil strips, to the lossy material.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

In some embodiments, a lossy member may be manufactured by stamping a preform or sheet of lossy material. For example, an insert may be formed by stamping a preform as described above with an appropriate pattern of openings. However, other materials may be used instead of or in addition to such a preform. A sheet of ferromagnetic material, for example, may be used.

However, lossy members also may be formed in other ways. In some embodiments, a lossy member may be formed by interleaving layers of lossy and conductive material such as metal foil. These layers may be rigidly attached to one another, such as through the use of epoxy or other adhesive, or may be held together in any other suitable way. The layers may be of the desired shape before being secured to one another or may be stamped or otherwise shaped after they are held together.

Figure 6:
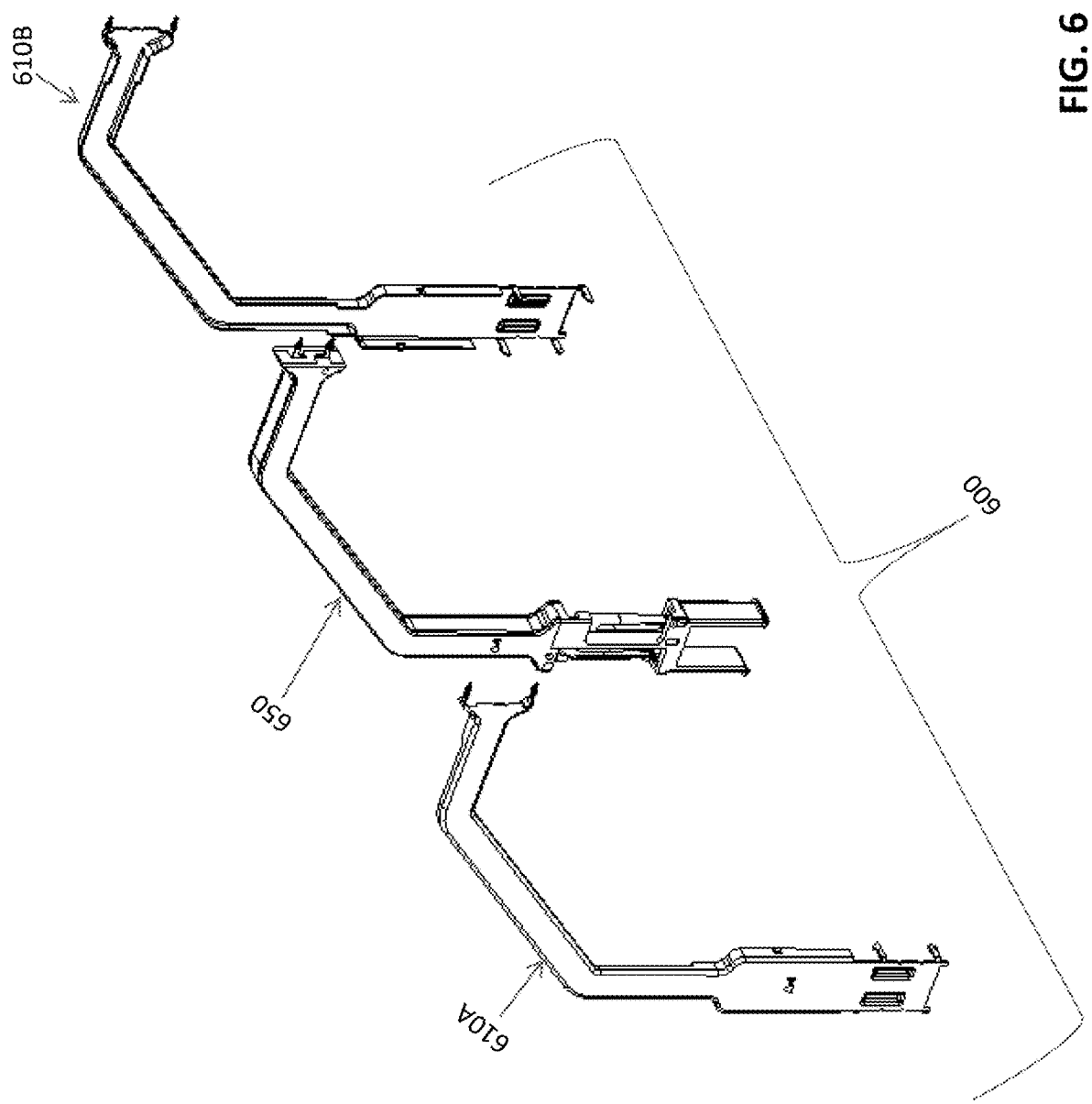
FIG. 6 is an isometric view, partially exploded, of a wafer module of the wafer assembly of FIG. 3, according to some embodiments.

FIG. 6 shows further details of construction of a wafer module 600. Module 600 may be representative of any of the modules in a connector, such as any of the modules 410A . . . 410D shown in FIGS. 3-4. Each of the modules 410A . . . 410D may have the same general construction, and some portions may be the same for all modules. For example, the contact tail regions 420 and mating contact regions 440 may be the same for all modules. Each module may include an intermediate portion region 430, but the length and shape of the intermediate portion region 430 may vary depending on the location of the module within the wafer.

In the embodiment illustrated, module 600 includes a pair of signal conductors held within an insulative housing portion 650. Insulative housing portion 650 is enclosed, at least partially, by reference conductors 610A and 610B. This subassembly may be held together in any suitable way. For example, reference conductors 610A and 610B may have features that engage one another. Alternatively or additionally, reference conductors 610A and 610B may have features that engage insulative housing portion 650. As yet another example, the reference conductors may be held in place once members 500A and 500B are secured together as shown in FIG. 3.

Figure 7:
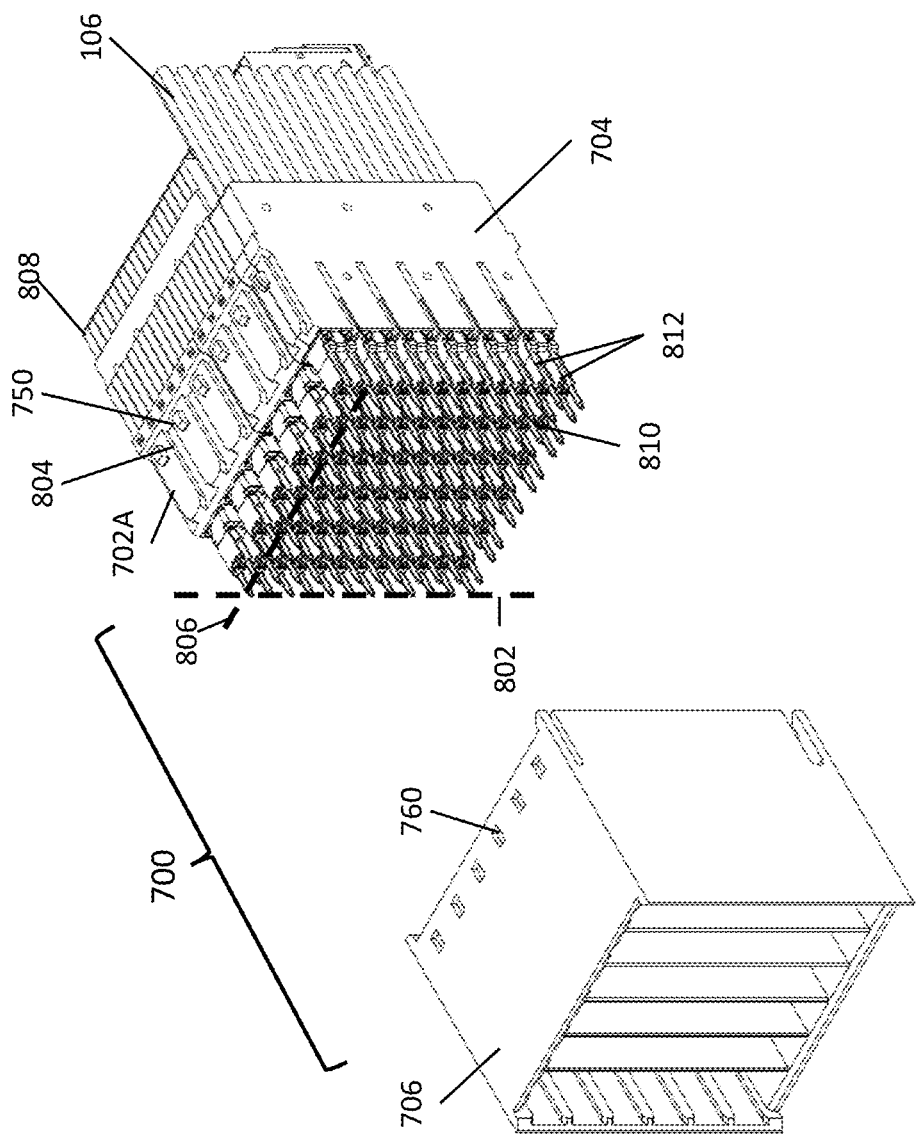
FIG. 7 is an isometric view, partially exploded, of a modular connector configured as a direct mate orthogonal connector of FIG. 1 configured for cabled connections, according to some embodiments.

In the embodiment of FIG. 7, a connector as shown in FIG. 2 is adapted in two ways to implement a connector with a configuration as shown in FIG. 1. First, some of the wafers as shown in FIG. 2 configured for mounting to a PCB are replaced with wafers that are terminated to cables. Second, the connector is adapted to serve as a direct mate orthogonal connector through the use of extender modules 810. Extender modules 810 mate at two ends with connector modules with signal conductors terminated with receptacle style mating contact portions, such as shown above in FIG.

6. Extender modules 810, in this embodiment, comprise pin style mating contact portions on two opposing ends. Both the extender modules and the wafers terminated to cables are held with shell 706 to provide a mating interface suitable for a direct mate orthogonal connector.

In this example, there are ten wafers held by member 702A, which may function as a front housing portion such as front housing portion 240 (FIG. 2). The wafers held by 702A are collectively attached to 60 extender modules 810. As each column of extender modules attaches to two wafers, those two wafers, and attached extender modules, may be regarded as a first type "unit," and a connector may be formed with any suitable number of such units.

However, it should be appreciated that each first type connector unit may be a subassembly of any suitable number of components to implement any suitable number of columns of conductive elements or may be implemented as a single component or in any other suitable way. Using wafers and extender modules as illustrated, each first type connector unit may be formed from a multiple of two wafers, such as two, four, six or eight wafers and a multiple of that number of extender modules, the multiple being equal to the number of signal conductors in one wafer, but the application is not limited in this regard.

If multiple units are used, the connector units may be held together by a support member. In the embodiment illustrated, extender shell 706 acts as a support member. The support member 804 may include retaining features 750 to engage with corresponding features 760 on the extender shell 706. It should be appreciated, however, that support members 804, in some embodiments, may be omitted, such as if wafers are attached directly to extender shell 706 or if other supporting structures are used to hold the components of the connector together.

Figure 8:
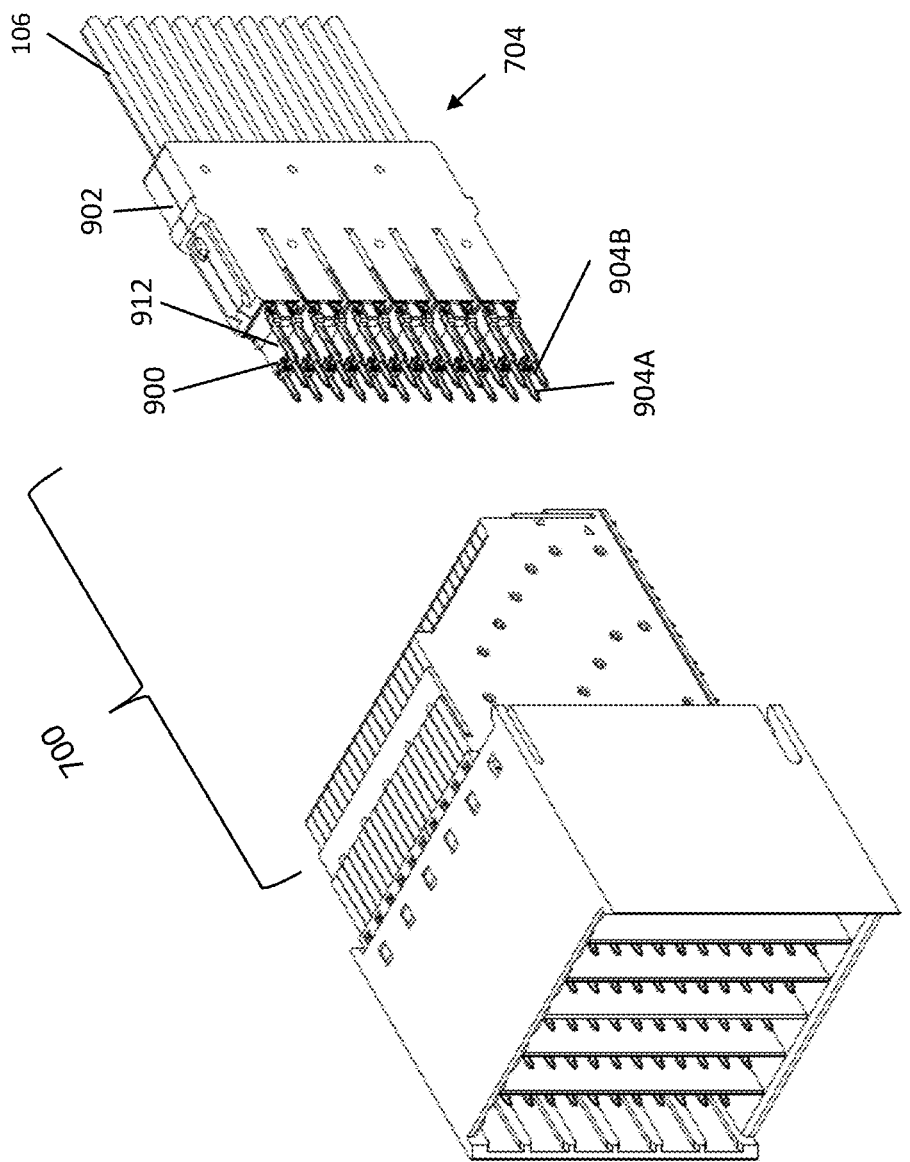
FIG. 8 is an additional view of the modular connector of FIG. 7.
Figure 9:
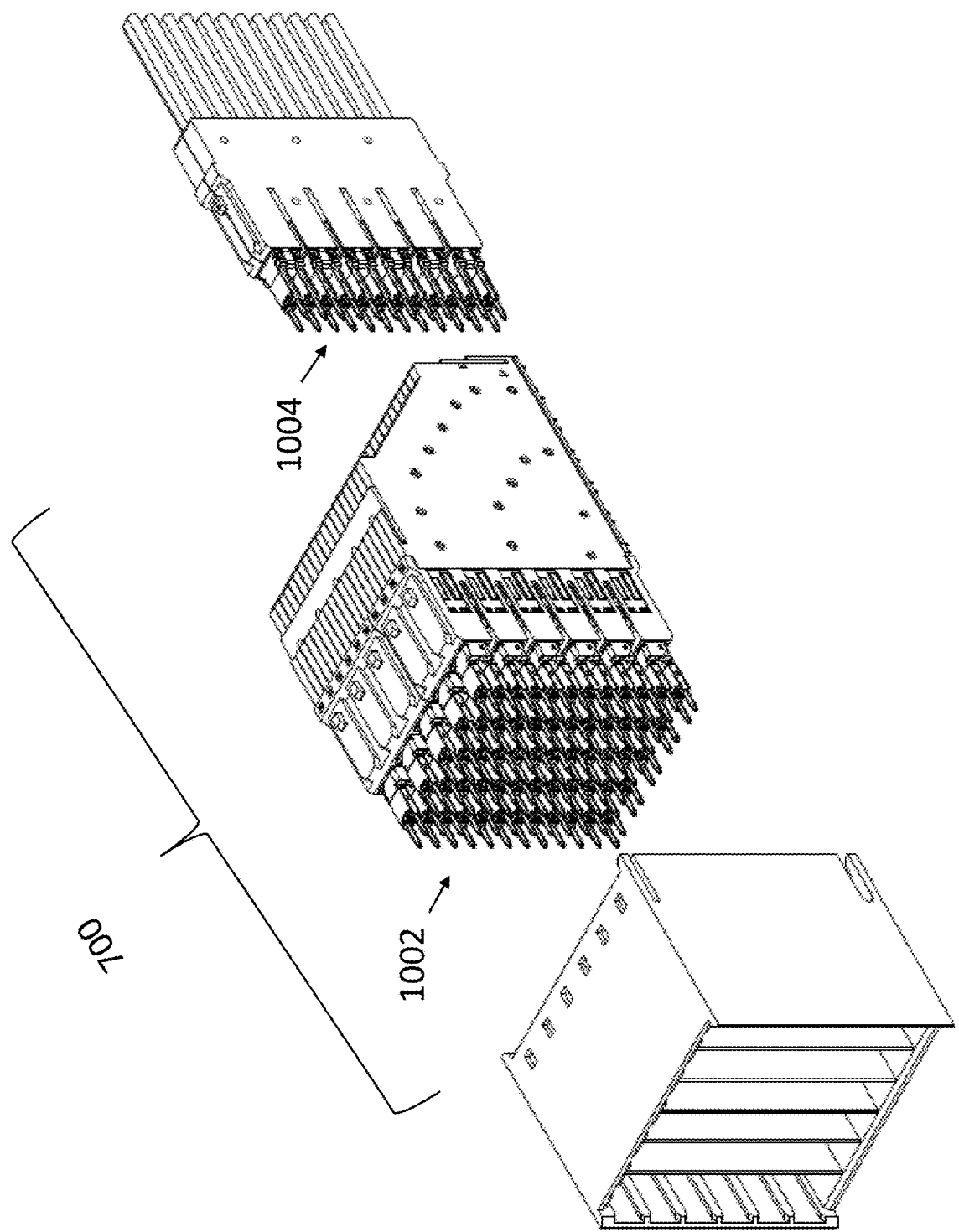
FIG. 9 is a further additional view of the modular connector of FIG. 7.

In FIGS. 7-9, the mating contact portions of the wafers 808 are covered by the support members 804 and not shown. However, the mating contact portions may be configured similarly to the mating contact portions of wafers 300 illustrated in FIG. 3. Each wafer module of a wafer 808 may include a pair of differential signal conductors. The mating contact portions of the wafer modules may be configured as receptacles adapted to receive the first mating contact portions of the extender modules, which may be configured as pins. The mating contact portions of the wafer modules in a wafer may be aligned in the direction of column 802. Adjacent wafer modules, each from one of the two wafers 808 in a first type connector unit 702, may receive first mating contact portions of an extender module assembly 812. As a result, second mating contact portions of the extender module assemblies may form an array 1002 (FIG. 9), in which pairs of differential signal conductors may be aligned in a direction of column 806 perpendicular to the direction of column 802.

In the illustrated example, there is one second type unit 704. To be complementary with the first type units, the illustrative second type unit 704 includes 12 cables 106 aligned in a direction of column 802. Each second type unit 704 may include a plurality of modules 900 held by a unit housing 902. The plurality of modules in a second type unit may be aligned in the direction of column 802. Each module 900 may include a module housing 912 holding a pair of signal conductors 904A, 904B. The pair of signal conductors are separated in the direction of column 806. The mating contact portions of the second type units may form an array 1004. The arrays 1002 and 1004 together may form a mating interface of the connector 700.

The mating contact portions of the signal conductors are illustrated as pins. However, other configurations may be adopted, e.g., receptacles. The contact tails (not shown) of the signal conductors are attached with cables 106. The attachment interface between the contact tails and the cables are protected by at least the unit housing. Each cable may include a pair of wires, each of which is attached to a respective contact tail of a pair of signal conductors of a module. In some embodiments, the cables may be twin-ax cables. A shield surrounding the conductors of the twin-ax cable may be attached to a shield surrounding the conductive elements in a respective module 900. The unit housing 902 may extend farther in the direction of cable length than support members 804 such that the attachment interface between the modules 900 and the cables 106 are covered.

FIGS. 10-21 show an embodiment of how cables may be terminated to a substrate 2. The cables, eight in this example, are terminated to connector which may be pressure mounted to a substrate 2. In the illustrated embodiment, ends of each of the cables is terminated to a connector, which in turn is attached to a substrate 2. Within connector 1000, each of the cables is terminated to a termination assembly 1008.

Connectors as shown in FIGS. 10-21 may be used to terminate first ends of cables used in cable interconnects, whereas connectors as described above may be used to terminate the second end of the cables in cabled interconnects. The connectors discussed in connection with FIGS. 10-21 are pressure mount connectors and may be mounted to a substrate with a downward force, normal to the surface of the substrate and provide an example of connectors that may be used in forming a cabled interconnect subassembly as described below.

Figure 10A:
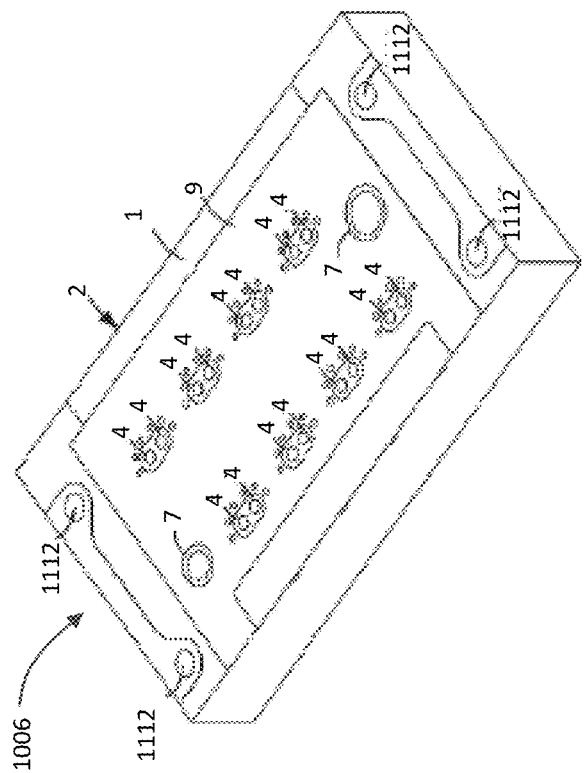
FIG. 10A is an isometric view of an exemplary pressure mounted connector for completing cabled connections to a substrate, according to some embodiments.
Figure 10B:
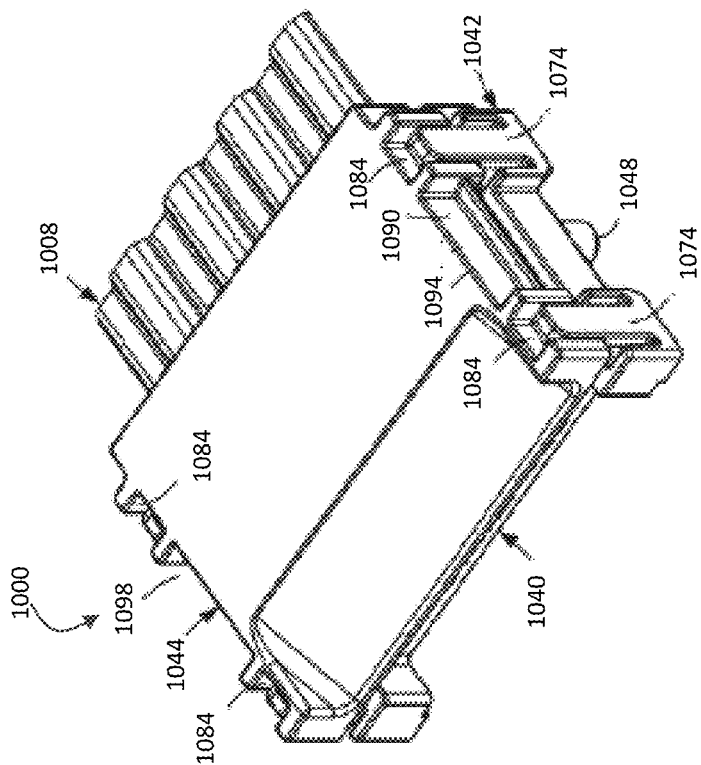
FIG. 10B is an isometric view of an exemplary footprint on a substrate, configured for mating with the connector of FIG. 10A, according to some embodiments.

FIG. 10B shows a section of the substrate 2 with a mounting location 1006 for a connector 1000. In this example, mounting location 1006 has signal pads 4 and a ground plane 9 for attachment by eight twinax termination assemblies 1008 arranged in two offset rows of four termination assemblies 1008. Peg holes 7 provide for alignment, as described below. In electronic devices in which multiple connectors are mounted to a substrate, a mounting location 1006 may be provided on a surface of the substrate for each of the connectors. However, it is not a requirement that each mounting location provide for attachment of eight twinax cables. In alternative embodiments, different mounting locations may be configured for mounting of different types or different sizes of connectors.

Figure 11:
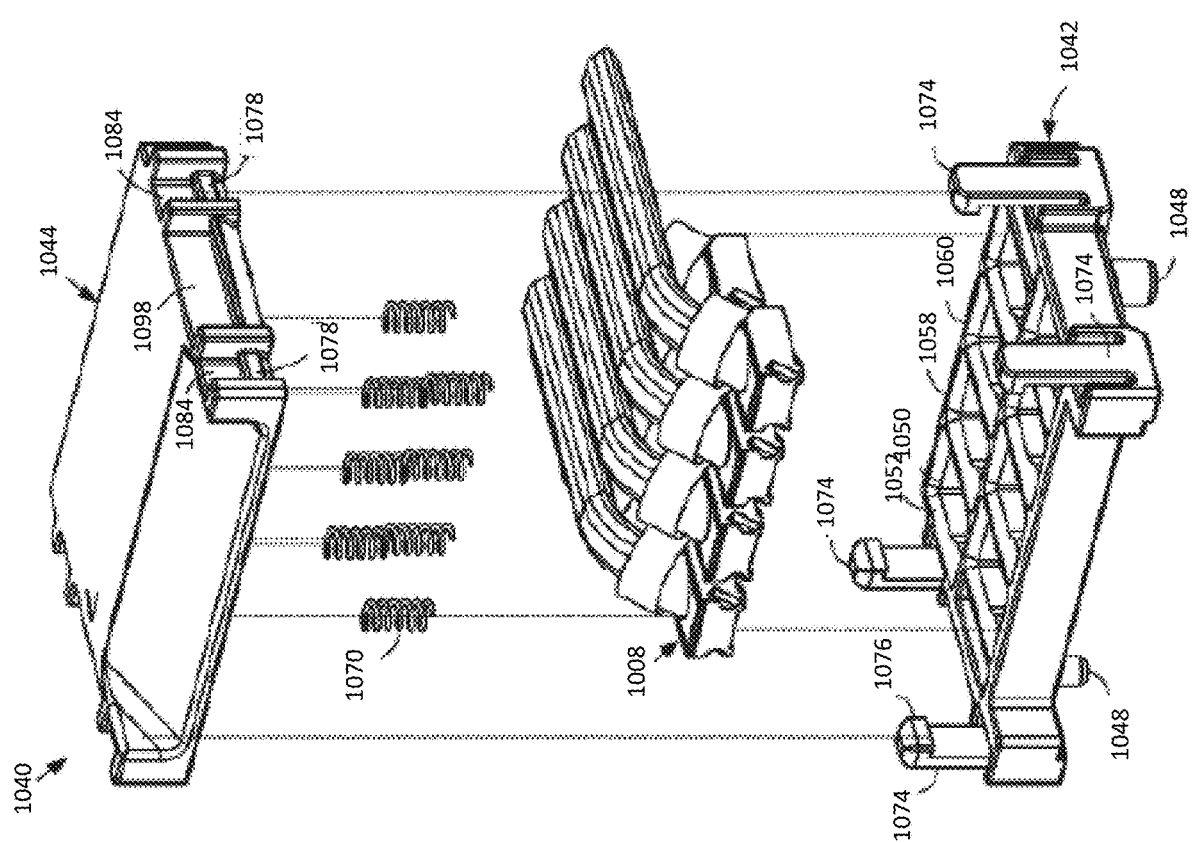
FIG. 11 is a partially exploded view of the connector of FIG. 10A.

The termination assemblies 1008 are removably attached to the substrate 2 by a frame 1040 that is comprised of a lattice 1042 and a cover 1044. The lattice 1042 is generally rectangular and has cutouts 1050 into which the termination assemblies 1008 are inserted, as shown in FIG. 11. Each cutout 1050 accepts an assembly 1008 through an opening 1052 in the top and the cutout 1050 is sized such that the assembly 1008 fits snuggly within the cutout 1050. The cable extends along the top 1058 of and out one side 1060 of the lattice 1042. The cutouts 1050 are arranged such that the compliant contacts 1030 (shown in FIG. 13) are aligned over the pads 4 and ground plane 9 when the frame 1040 is attached to the substrate 2.

Alignment pegs 1048 extend from the bottom of the lattice 1042.

The cover 1044 secures the assemblies 1008 in the lattice 1042. The cover 1044 is generally flat so that it can lay on the assemblies 1008. Optionally, the cover 1044 has channels 1064 for the cables, as shown in FIG. 12A.

Figure 12B:
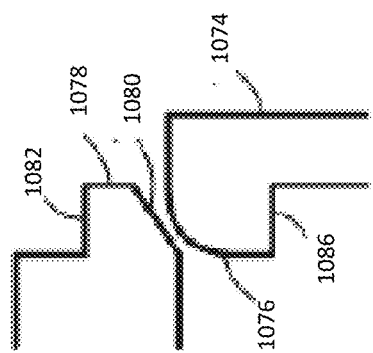
FIG. 12B is a schematic illustration of a latch for holding together components of the connector of FIG. 10A.
Figure 12A:
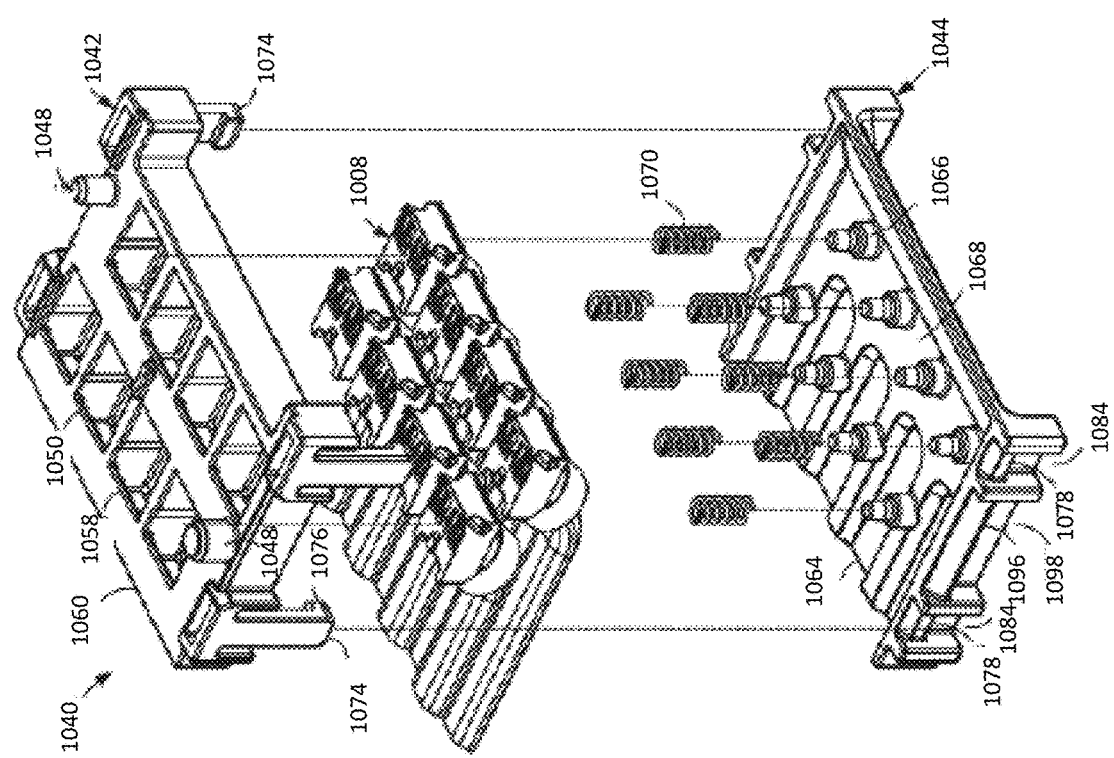
FIG. 12A is a bottom, partially exploded view of the connector of FIG. 10A.
Figure 13:
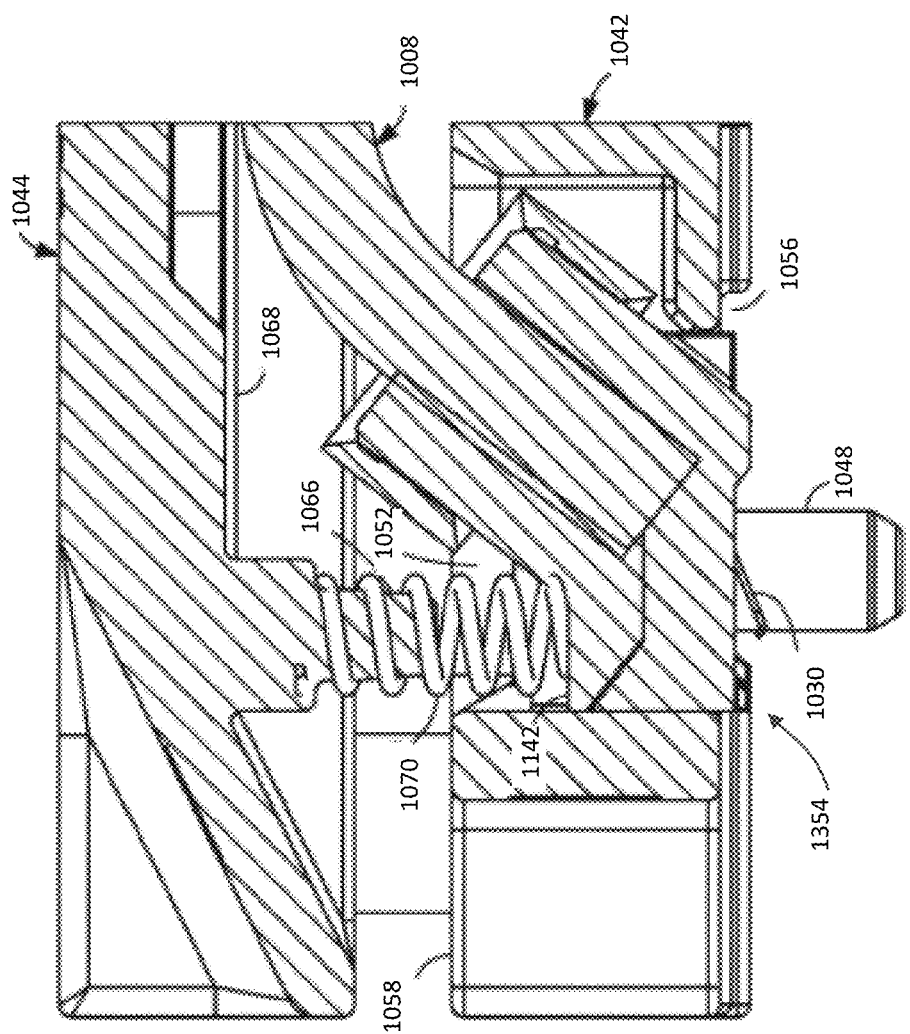
FIG. 13 is a side, cross section of the connector of FIG. 10A.

FIG. 12A illustrates the cover 1044, with posts 1066 extending from the bottom 1068, each of which is aligned with a cutout 1050. A coil spring 1070 sits on the post 1066 and, when the cover 1044 is installed on the lattice 1042, pushes against the cap spring surface 1142 of the assembly 1008, as shown in FIG. 13, to bias the assembly 1008 against the cutout floor 1354 so that the compliant contacts 1030 extend from the floor apertures 1056.

The cover 1044 attaches to the lattice 1042 by clips 1074 extending from the corners of the lattice 1042. The clips 1074 are L-shaped digits with a right-angle finger 1076 and that can flex outwardly, as shown in FIG. 12B. The cover 1044 has a flange 1078 within a notch 1084 at each corner. Each flange 1078 has a beveled lower surface 1080 and a flat upper surface 1082, also shown in FIG. 12B.

To install the cover 1044 on the lattice 1042, the cover 1044 is placed on the clips 1074 so that the clips 1074 are aligned with the flange notches 1084. As the cover 1044 is pushed into the clips 1074, the beveled lower surface 1080 of the flanges 1078 force the clips 1074 outwardly. The notches 1084 maintain alignment between the lattice 1042 and the cover 1044. As the flanges 1078 pass the clip fingers 1076, the clips 1074 snap inwardly so that the flat bottom surface 1086 of the fingers 1076 abut the flat upper surface 1082 of the flanges 1078, thereby preventing removal of the cover 1044. The cover 1044 can be removed by manually pulling the clips 1074 away from the flanges 1078.

Figure 14B:
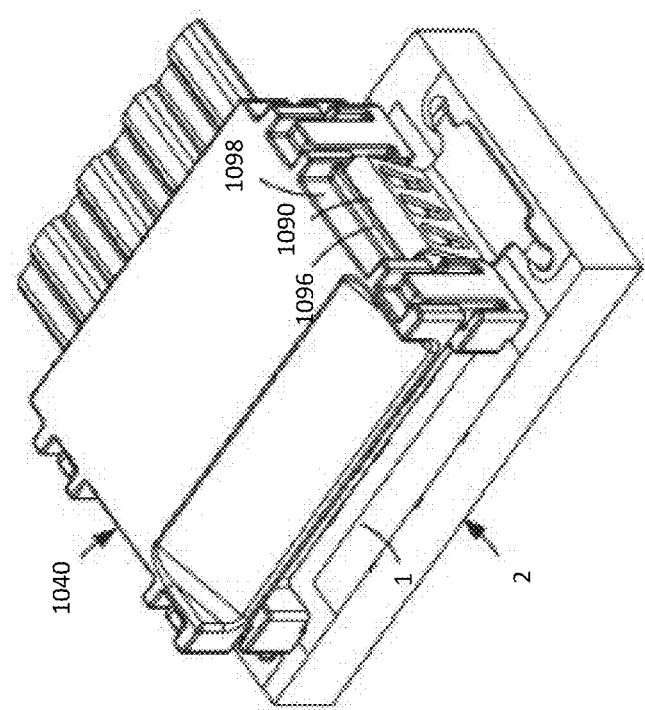
FIG. 14B is an isometric view of the connector of FIG. 10A mated with the substrate.
Figure 14A:
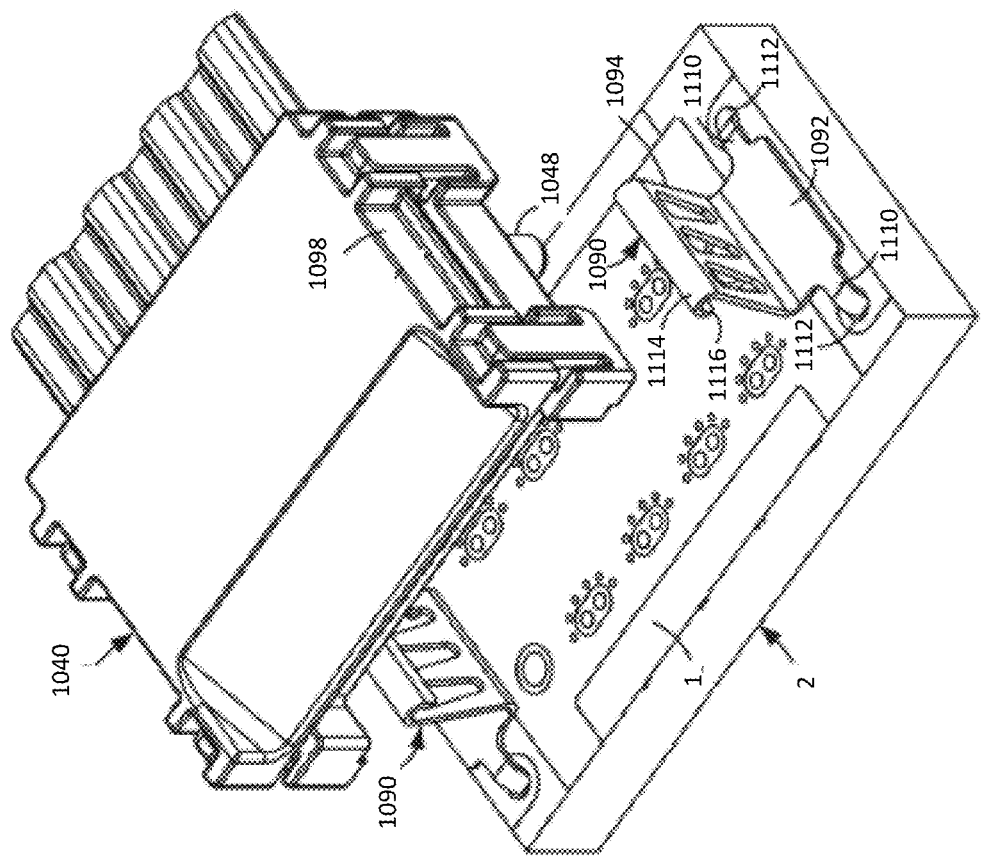
FIG. 14A is an isometric view of the connector of FIG. 10A aligned with the substrate for mating.
Figure 15B:
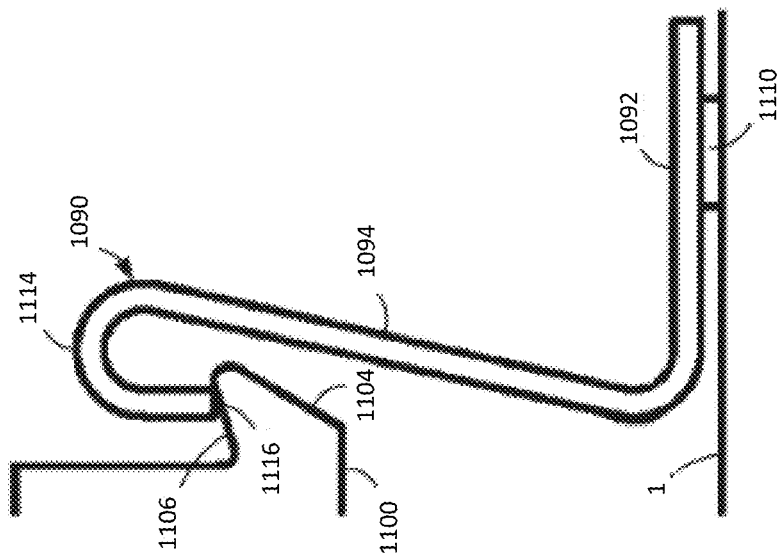
FIG. 15B is a side, schematic illustration of a latch for latching the connector of FIG. 10A to the substrate, according to some embodiments.
Figure 15A:
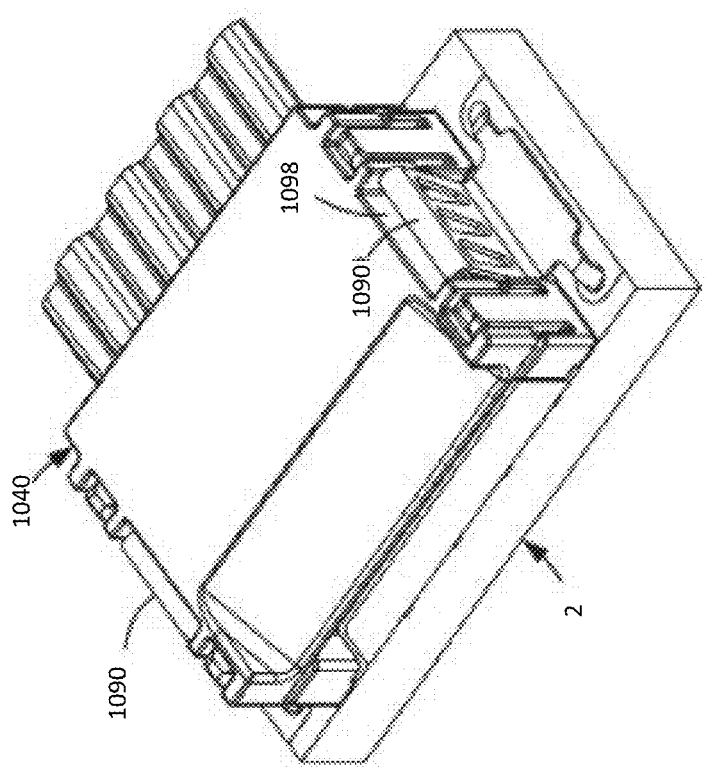
FIG. 15A is a further isometric view of the connector of FIG. 10A mated with the substrate.

The frame 1040 is removably attached to the substrate 2 by clips 1090 mounted to the device 2, as in FIG. 14A. The clips 1090, shown in FIG. 15B, are generally L-shaped with a base 1092 against the substrate 2 and an arm 1094 extending approximately perpendicularly away from the base 1092. At end of each arm 1094 is a finger 1114 that curves inwardly and downwardly to a free edge 1116. The clip base 1092 has two or more fingers 1110 bent at right angles to the base 1092. The fingers 1110 go into plating through holes 1112 in the substrate 2 (shown in FIG. 14A) and are soldered to the plating. The through-hole solder joining process takes advantage of existing pick and place equipment and reflow ovens to easily and quickly install components like these clips 1090 onto the substrate 2. Since the clips 1090 are not part of the connector 1000, they can go through the reflow process without exposing the cables in the termination assembly 1008 to excessive temperatures.

The cover 1044 has a rail 1100. Each rail 1100 has a beveled lower surface 1104 and an upper surface 1106 that is angled slightly upwardly away from the cover 1044.

To install the frame 1040 on the substrate 2, cover 1044 is placed on the clip arms 1094 so that the clip arms 1094 are aligned with the rail notches 1098 and the alignment pegs 1048 are aligned with the peg holes 7. As the cover 1044 is pushed into the clips 1090, the beveled lower surface 1104 of the rails 1100 force the clip arms 1094 outwardly. The notches 1102 maintain alignment between the frame 1040 and the substrate 2. As the rails 1100 pass the clip fingers 1114, the clip arms 1094 snap inwardly so that the free end 1116 of the fingers 1114 abut the upper surface 1106 of the rails 1100, thereby preventing removal of the frame 1040 from the substrate 2. The slight angle of the upper surface 1106 prevents the clip finger 1114 from slipping off of the rail 1100. The frame 1040 can be removed by manually pulling the clip arms 1094 away from the rails 1100.

Figure 16:
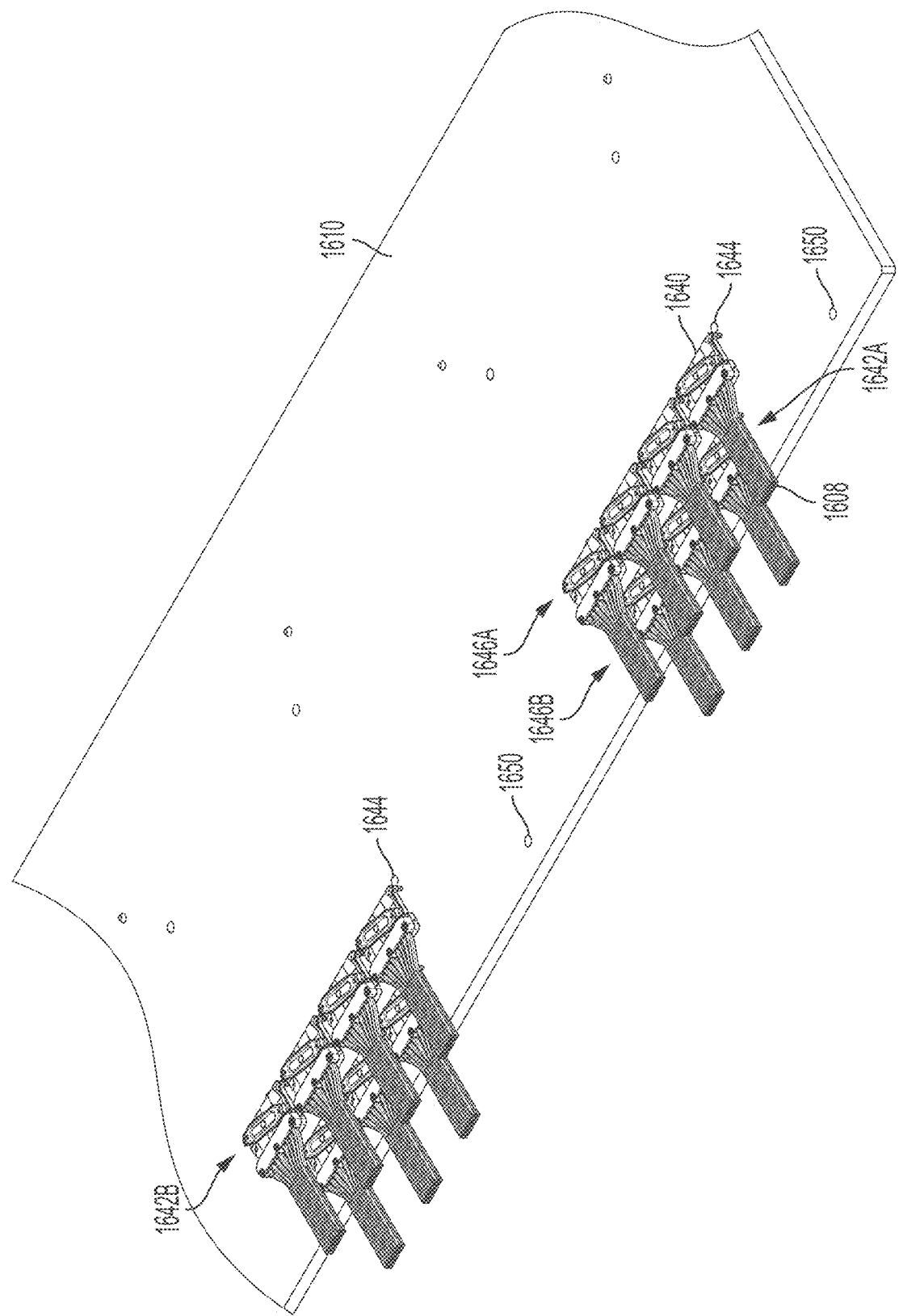
FIG. 16 is an isometric view of a portion of an electronic device in which a plurality of first type connectors, here shown as pressure mount connectors, in a plurality of groups terminate first ends of a plurality of cables and are attached to a substrate in the electronic device, according to some embodiments.

FIG. 16 illustrates a portion of an electronic device that may include multiple cabled interconnects. FIG. 16 shows only the first ends of cables of cabled interconnects where the first ends of the cables are terminated to connectors which are then mounted to a substrate. The second ends of the cables are shown cutaway for simplicity, as are other portions of a cabled interconnect subassembly that may be present.

In this example, connectors 1640 make connections between the first ends of cables 1608 and a substrate, here illustrated as PCB 1610. PCB 1610 may have processors, ASICs or other high performance components mounted to it, which are not shown for simplicity.

In the illustrated embodiment, each of the connectors 1640 is configured for mounting to a substrate, such as PCB 1610, via a downward force perpendicular to the surface of the substrate. Connectors 1640 may be pressure mount connectors. The connectors, for example, may have a mating interface as described above in connection with FIGS. 10A-15B. Accordingly, though not visible in FIG. 16, PCB 1610 may have a mounting location for each of the connectors 1640, such as the mounting location illustrated in FIG. 10B. Each mounting location may have components to hold the connector to PCB 1610, such as is illustrated above in connection with 14A and 14B. Accordingly, each of the connectors 1640 may be mounted to PCB 1610 by a force on the connector that pushes it into engagement with the components on PCB 1610.

In the portion of the electronic device visible in FIG. 16, groups 1642A and 1642B of connectors mounted to PCB 1610 are visible. Each of the groups may be adjacent a high performance component, so as to require only short trace lengths within PCB 1610 to carry signals between the connectors 1640 and the high performance components.

In the illustrated embodiment, each of the groups 1642A and 1642B includes the same number of connectors mounted in the same pattern. Each group has two linear arrays 1646A and 1646B of connectors. In the embodiment illustrated in FIGS. 18-24, below, different organizers are used for each of the groups. The organizer may be positioned relative to PCB 1610 via alignment features on PCB 1610, such as holes 1644, adjacent each of the groups. Additional alignment features on PCB 1610 may also be present, but are not visible in FIG. 16.

In embodiments in which the organizers are part of a cable interconnect subassembly that includes a support, PCB 1610 may include features for mechanically connecting the substrate to the support. In this example, two holes 1650 are visible and may receive bolts or other fastening members that secure the support to the substrate.

Figure 17:
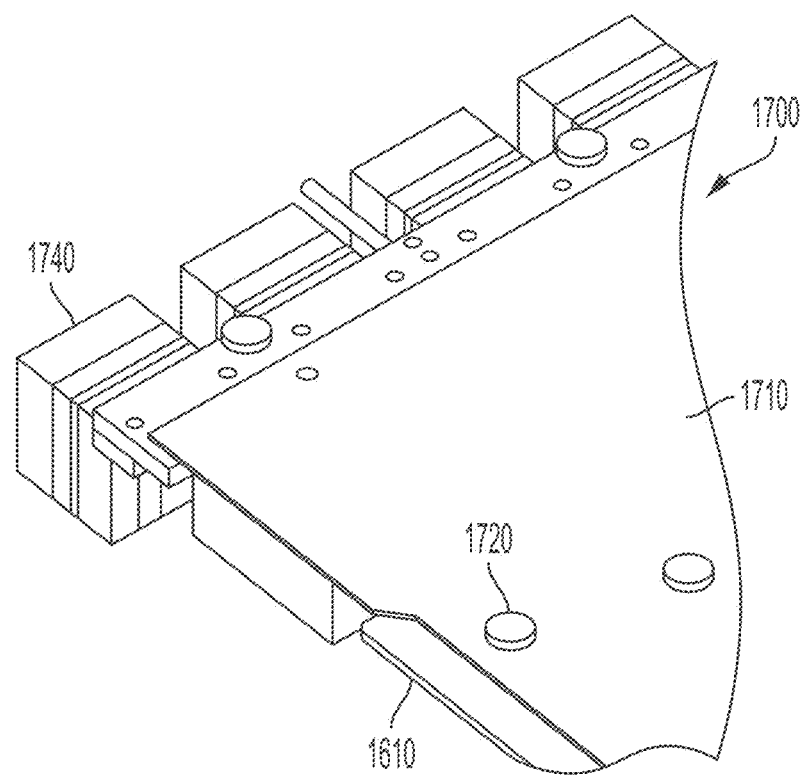
FIG. 17 is an isometric view of a portion of a subassembly of the electronic device of FIG. 16 in which a plurality of second type of connectors, here shown as direct mate orthogonal connectors, attached to a support, terminate second ends of the cables.

FIG. 17 shows a portion of a cable interconnect subassembly 1700 attached to PCB 1610. In this example subassembly 1700 includes a support 1710 to which a plurality of second connectors 1740 are attached. The opposite, first ends of the cables are cutaway for simplicity. Support 1710 provides mechanical support to second connectors 1740 and attaches them to PCB 1610, such as with bolts 1720 passing through holes 1650. Support 1710 may be constructed with one or more members, which may be shaped to provide strength and rigidity, mounting locations for the second plurality of connectors 1740 and to position the cables connecting the second plurality of connectors 1740 with the first plurality of connectors 1640.

In the example of FIG. 17, the second plurality of connectors 1740 may have mating interfaces that support direct mate orthogonal connections, such as is illustrated in FIG. 1. Each of the second plurality of connectors 1740 may be constructed using techniques as described above in connection with FIGS. 7-9. In this example, however, all the connections through the connectors may be cabled connectors. Accordingly, the connector may be fully assembled with units 704, configured for making cabled connections, as discussed above in connection with FIG. 7. Though not shown in FIG. 17 for simplicity, cables 1608 may be routed through the subassembly to connect the second plurality of connectors 1740 with the first plurality of connectors 1640. Each of the second plurality of connectors 1740 may be connected to any one or more of the first plurality of connectors 1640, and vice versa, such that the arrangement of cables interconnecting the first and second plurality of connectors may be complex. By making those connections as part of a subassembly, the connections can be made on a location equipped for accurately making such complex connections that increases the reliability of the resulting electronic device.

Figure 18:
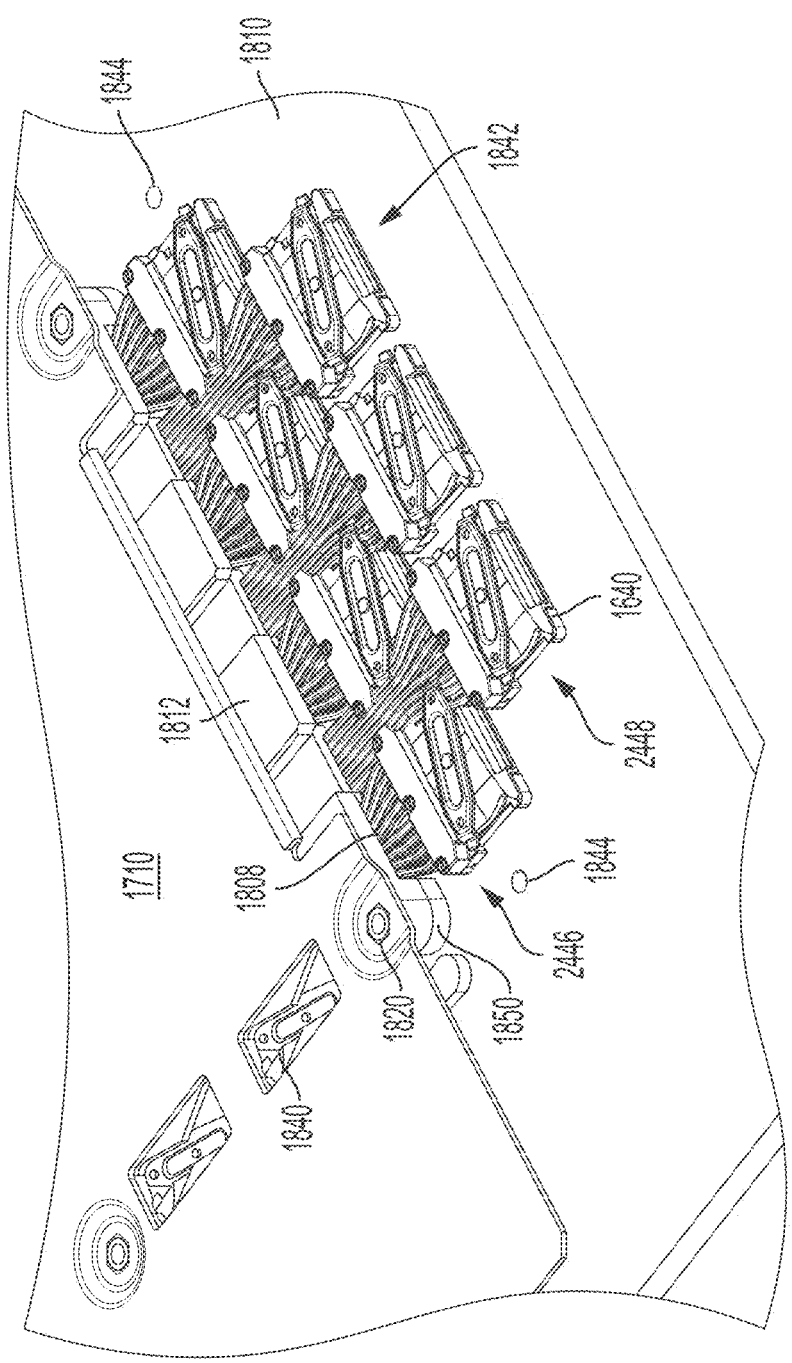
FIG. 18 is an isometric view of a group of the first type connectors of FIG. 16 in which the subassembly of FIG. 17 is shown attached to the substrate.

FIG. 18 shows subassembly 1700 attached to PCB 1810 with a group 1842 of connectors 1640, terminated to a first end of cables 1808 with the subassembly already mounted to PCB 1810. In this example, subassembly 1700 is mounted to PCB 1810 with spacers 1850 in between 1710 and PCB 1810. Nuts 1820, secured to bolts 1720, holds the subassembly 1700 and PCB 1810 together. With spacers 1850 in place, cables 1808 may be routed through subassembly 1700 to make connections between the second plurality of connectors 1740 and the first plurality of connectors 1640. Subassembly 1700 may include other connectors, such as connectors 1840, which may also be mounted to PCB 1810 using techniques as described herein.

Figure 19:
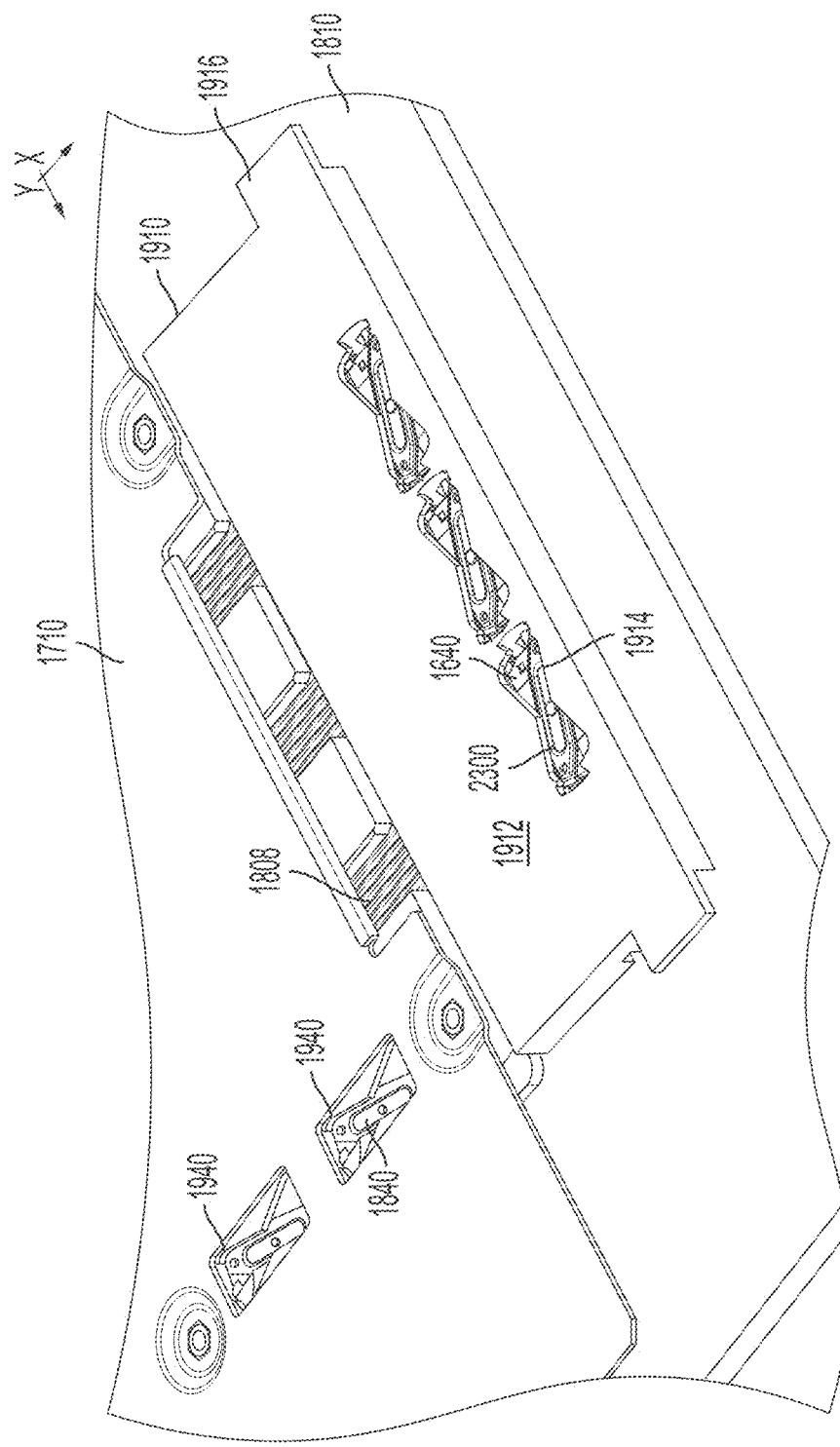
FIG. 19 is an isometric view of an organizer for attaching a subset of the group of the first type connectors of FIG. 18.

In the state shown in FIG. 18, connectors 1640 are shown already mounted to PCB 1810. FIG. 19 shows a step in the attachment process in which a removable organizer 1910 is used to position multiple connectors for attachment to PCB 1810. Separate organizers may be used for each group of connectors. In this example, a separate organizer is used for each linear array of connectors within a group. A second organizer (2010, FIG. 20) is nested with organizer 1910 and is not visible in FIG. 19.

Organizer 1910 releasably holds a plurality of connectors in a predetermined orientation. Organizer 1910 may be made of plastic. Fiberglass fibers or other reinforcing materials may be included in organizer 1910. Examples of other suitable materials for forming organizer 1910 include die cast or machined metal. In this example, organizer 1910 is formed as a unitary component, such as by molding. In other embodiments, organizer 1910 may be formed of multiple members, which may be made of different materials.

In the illustrated embodiment, organizer 1910 releasably holds three connectors 1640 in a linear array. Each of the connectors is positioned within an opening 1914. The openings 1914 extend through an upper surface 1912 of organizer 1910. Latch members 2300 on connectors 1640 are exposed through the openings 1914. Latch members 2300 form a rotatable latch, which may be rotated into a position to engage with organizer 1910 to hold their respective connectors 1640 in organizer 1910. Connectors 1640 may be latched in organizer 1910 for transport of subassembly 1700 and for positioning organizer with respect to PCB 1810. Connectors 1640 may be released from the organizer for mounting to PCB 1810 and/or removing the organizer. To release connectors 1640, latch members 2300 may be rotated into a position in which they are disengaged from organizer 1910, enabling connectors 1640 to move within openings 1914.

Figure 20:
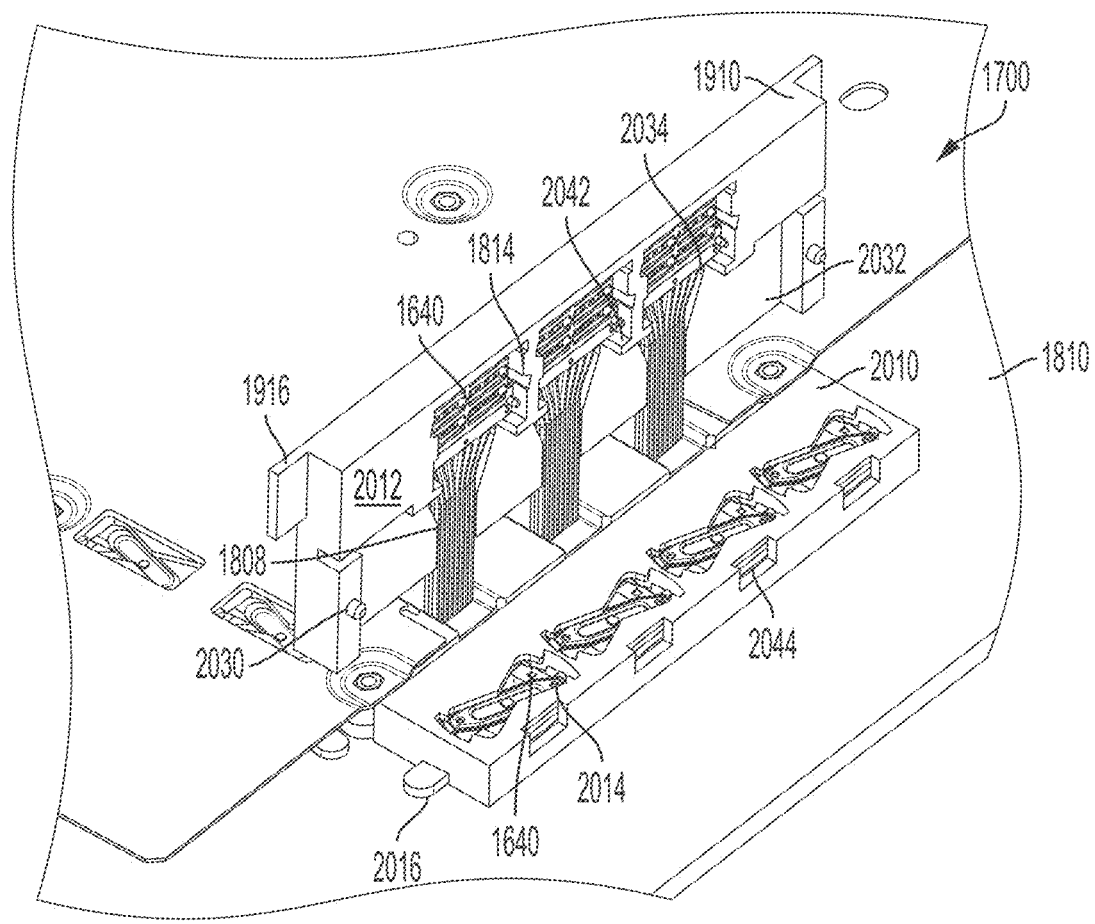
FIG. 20 is an isometric view of the organizer of FIG. 19 rotated into a position uncovering a second organizer for attaching a second subset of the group of the first type connectors of FIG. 18.

FIG. 20 shows organizer 1910 in a position in which it is not aligned with respect to PCB 1810. Rather, organizer 1910 has been rotated such that a surface 2012, opposite surface 1912, is visible. Organizer 1910 may include features that aid in rotation into the position shown in FIG. 20. These features may include tabs, such as tabs 1916 that may be grasped by a human assembly technician or robotic assembly device.

In the view of FIG. 20, openings 1914 are visible extending through surface 2012. The portions of the openings 1914 extending through surface 2012 are large enough for connectors 1640 to pass through surface 2012 within openings 1914. In the example of FIG. 20, connectors 1640 are latched within openings 1914 with their mounting interfaces facing the same direction as surface 2012. The mounting interfaces of connectors 1640 may be set back from surface 2012 such that the mounting interface is protected from damage.

In the state shown in FIG. 19 in which organizer 1910 is aligned with respect to PCB 1810, surface 2012 faces and may contact the surface of PCB 1810 to which connectors within organizer 1910 are to be mounted. When organizer 1910 is positioned with respect to PCB 1810, surface 2012 may parallel the surface of PCB 1810. The mounting interfaces of connectors 1640 will similarly face the surface of PCB 1810 containing mounting locations for connectors 1640. Upon release of connectors 1640 the connectors may move within openings 1914 towards and through surface 2012, such that the connectors may engage mounting locations on the surface of PCB 1810.

As described above in connection with FIGS. 14 and 15, each of the mounting locations may include one or more latching features that engage pressure mount connectors when pushed against the surface. When an organizer such as organizer 1910 is used, force to move connectors 1640 towards and/or through surface 2012 may be supplied through the portions of openings 1914 that extend through surface 1912.

Surface 2012 may include features that protrude from or are recessed into a body of organizer 1910 to enable assembly of the electronic device. For example, organizer 1910 may have recesses that provide clearance around connectors within openings 1914 to receive latching features extending from the surface of PCB 1810. As an additional example, alignment features may be included to engage with complementary alignment features on PCB 1810. In some embodiments, the alignment features are protrusions extending from surface 2012. Here, alignment posts 2030 are shown. Alignment posts may engage with openings in PCB 1810, such as holes 1844.

Additionally, recesses may be included to accommodate cables 1808. In the example of FIG. 20, cable channels 2034 open into each of the openings 1914 such that cables attached to connectors within the openings may be routed out of the openings 1914. In this example, the cable channels 2034 are also open to and through surface 2012 such that connectors 1640, with cables attached, may be inserted into or removed from organizer 1910 through surface 2012.

In the embodiment illustrated, each linear array of connectors 1640 is positioned by a separate organizer. Organizer 2010, for example, may have openings 2014, which may be like openings 1914 described for organizer 1910 for releasably holding a plurality of connectors. In this example, organizer 2010 releasably holds four connectors, and those connectors are mounted on PCB 1810 closer to subassembly 1700 than the connectors held by organizer 1910. As a result, cables 1808 terminating the connectors in organizer 1910 may extend over the connectors in organizer 2010. The organizers may be configured to enable this cable routing. Organizer 2010, for example, may nest within organizer 1910 with cables 1808 terminated to connectors in organizer 1910 within routing channels that pass over organizer 2010.

Organizer 1910 may have a recessed portion 2032 sized to receive organizer 2010. Either or both of organizers 1910 and 2010 may include features to hold organizers 1910 and 2010 together, which may facilitate operations such as attaching subassembly 1700 to PCB 1810, in which access to the connectors in the individual organizers is not required. The organizers may be held with sufficient separation, however, that cables 1808 terminated to connectors in organizer 1910 are not damaged as a result of being crushed between organizers 1910 and 2010. In the example of FIG. 20, organizer 2010 includes slots 2044 into which tabs 2042 on organizer 1910 may be inserted. Tabs 2042 and slots 2044 may be sized to create a friction fit between the parts, holding them together with a desired distance between them, but enabling the organizers 1910 and 2010 to be separated with sufficient force to overcome the frictional engagement.

Organizer 2010 may additionally include features for alignment of organizer 2010 with PCB 1810 such that openings 2014 align with mounting locations for the connectors held within openings 2014. The alignment features on organizer 2010 may align with the same or different alignment features on PCB 1810 as organizer 1910. FIG. 20 illustrates an embodiment in which the same alignment features, such as holes 1844, are used to align both organizers 1910 and 2010 with respective connector mounting locations. In this example, the organizer 2010 includes tabs 2016 extending from a body of the organizer 2010. Posts, which may be shaped like alignment posts 2030, may extend from the lower surfaces (not visible in FIG. 20) of tabs 2016.

Such a configuration may reduce the number of precisely drilled holes on PCB 1810. In operation, organizer 2010 may be positioned with respect to PCB 1810 by engagement of alignment features on organizer 2010 with complementary alignment features on PCB 1810. The connectors 1640 releasably held within organizer 2010 may then be released and engaged to PCB 1810. Organizer 2010 may then be removed and organizer 1910 may then be aligned with PCB 1810, using the same complementary alignment features on PCB 1810. Once the connectors within organizer 1910 are similarly attached to PCB 1810, organizer 1910 may also be removed.

Figure 21:
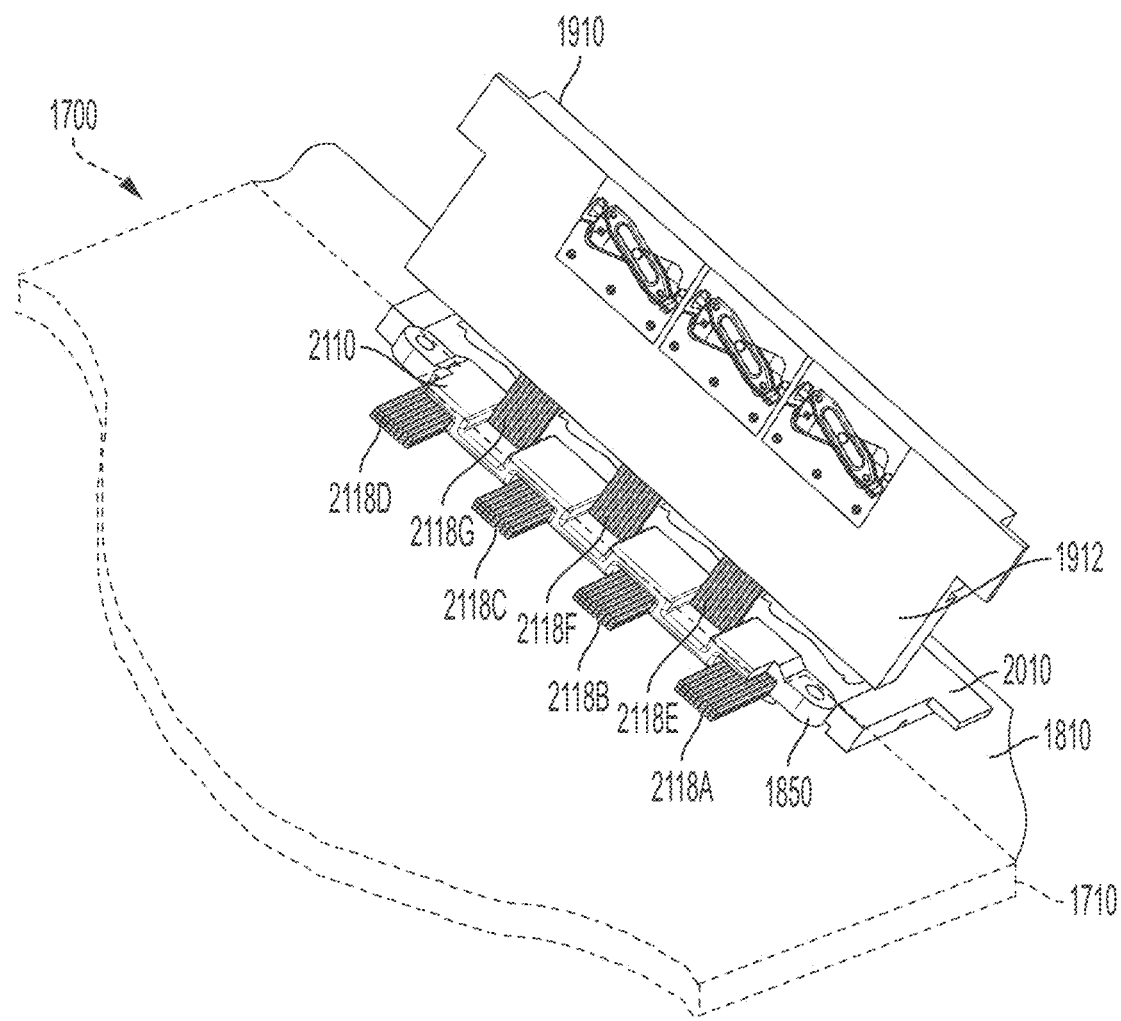
FIG. 21 is an alternative isometric view of the organizer of FIG. 19 rotated into a position uncovering the second organizer of FIG. 20, with the support of the subassembly shown in phantom.

FIG. 21 illustrates an alternative view of a portion of an electronic device formed of a substrate, such as PCB 1810, and a cable interconnect subassembly, such as subassembly 1700. In this example, support 1710 is shown in phantom, revealing a cable guide 2110. Subassembly 1700 may include one or more cable guides to position cables within subassembly 1700.

Cable guide 2110 may be molded of plastic. In this example spacers 1850 are integral with cable guide 2110, and also provide a means to secure cable guide 2110 to support 1710 and PCB 1810. Cable guide 2110 is shaped to provide multiple channels for cables being routed to the connectors held within each of the organizers 1910 and 2010. In this example, each of cable groups 2118A, 2118B, 2118C, and 2118D is routed to a connector releasably held within organizer 2010. Each of cable groups 2118E, 2118F, and 2118G is routed to a connector releasably held within organizer 1910. In FIG. 21, cable groups 2118A, 2118B, 2118C, 2118D, 2118E, 2118F, and 2118G are shown cut off. The second ends of the cables in those groups are not shown, but may be terminated to a second plurality of connectors, such as connectors 1740 (FIG. 17) which may be mounted along a second edge of support 1710.

In the configuration shown in FIG. 21 cable guide 2110 has a corrugated shape, creating channels alternatively above or below the guide 2110. Cable groups 2118A, 2118B, 2118C, and 2118D are captured in channels between a lower surface of cable guide 2110 and an upper surface of PCB 1810. These channels may align with the channels into openings 2014 in organizer 2010. Cable groups 2118E, 2118F, and 2118G are shown extending through channels in the upper surface of cable guide 2110. These channels may align with channels 2034 into openings 1914 in organizer 1910.

Cable groups 2118A, 2118B, 2118C, 2118D, 2118E, 2118F, and 2118G may be held within respective channels of cable guide 2110 firmly enough that organizers 1910 and 2010 are roughly positioned relative to support 1710 by the cable groups. In some embodiments, each of the cable groups may include multiple, such as 16 or more, twinax cables. In some embodiments, additional members may be included in a cable group, such as a plastic jacket over the twinax cables or fiber reinforced wrapping for additional strength.

In the embodiment illustrated, the cable groups 2118A, 2118B, 2118C, 2118D, 2118E, 2118F, and 2118G are not so rigid and not held so firmly within the channels of cable guide 2110 that all movement of organizers 1910 and 2010 is foreclosed while the connectors 1640 terminating the ends of the cables in the cable groups are latched in the organizers 1910 and 2010. In some embodiments, the retention by cable guide 2110 is sufficiently loose that organizers 1910 and 2010 may be moved. For example, as illustrated in FIGS. 20 and 21, organizer 1910 may be rotated upwards to expose organizer 2010, with cable groups 2118E, 2118F, and 2118G moving within their respective channels through guide 2110 to enable this range of motion.

Further the retention of cable groups 2118A, 2118B, 2118C, 2118D, 2118E, 2118F, and 2118G within their respective channels is loose enough to enable movement of organizers 1910 and 2010 relative to support 1710 in a plane parallel PCB 1810. With this movement, organizers 1910 and 2010 may each be positioned with respect to PCB 1810 by alignment features, such as 2030 and complementary holes 1844.

Figure 22:
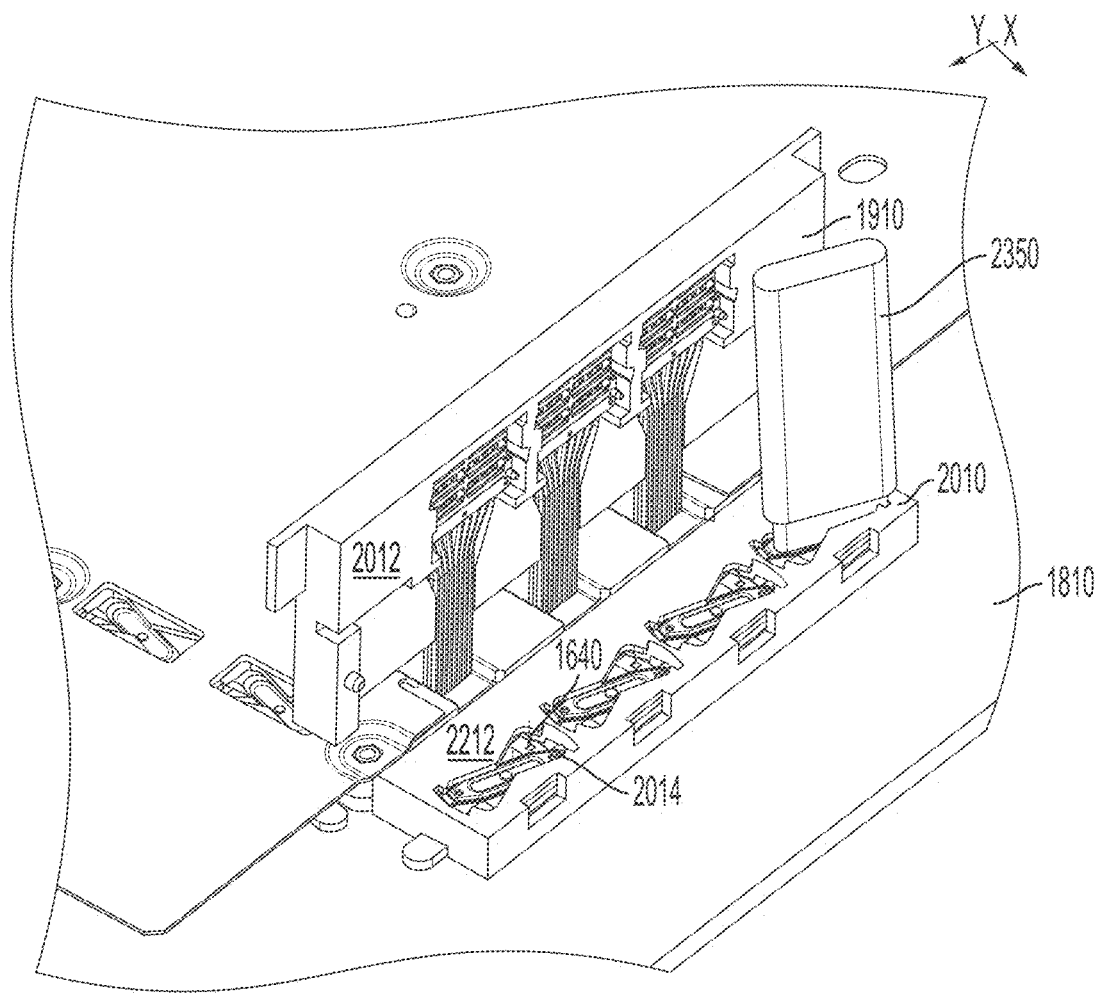
FIG. 22 is an isometric view of an exemplary tool engaged with a connector of the second subset of FIG. 20, for releasing the connector from the organizer and applying a force to attach the connector to the substrate.

These alignment features position the organizers 1910 or 2010 relative to PCB 1810 such that the connectors 1640 releasably held within the organizers are aligned in two dimensions, denoted X and Y in FIG. 22, with the mounting locations for those connectors on the surface of PCB 1810. In this example, the two dimensions X and Y define a plane parallel to the upper surface of PCB 1810.

FIG. 22 illustrates that, with organizer 2010 aligned with PCB 1810, connectors 1640 may be released from organizer 2010 and then pressed in a third dimension, normal to the surface of PCB 1810, to mount the connectors to the surface of PCB 1810. In the example illustrated in FIG. 22, a tool 2350 may be used for both releasing and applying a force to push the connector into engagement with PCB 1810.

Figure 23C:
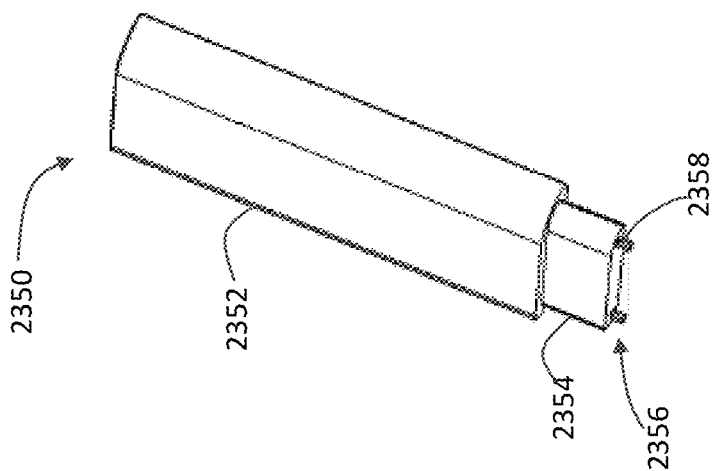
FIG. 23C is an isometric view of an exemplary embodiment of the tool of FIG. 22 useable with the latch of FIG. 23A.
Figure 23B:
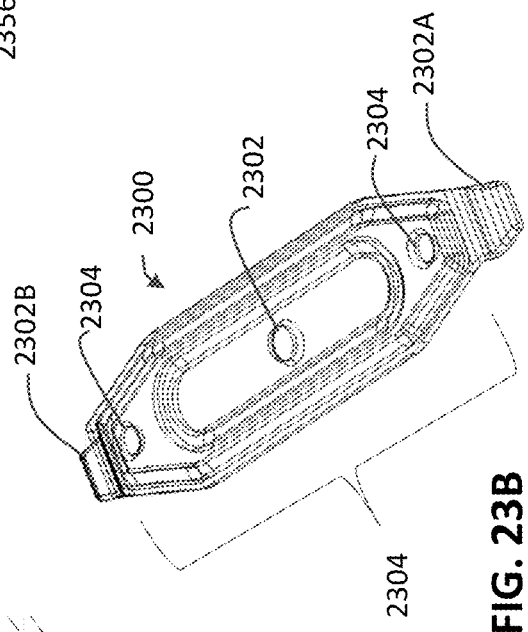
FIG. 23B is an enlarged view of a member forming the rotatable latch.
Figure 23A:
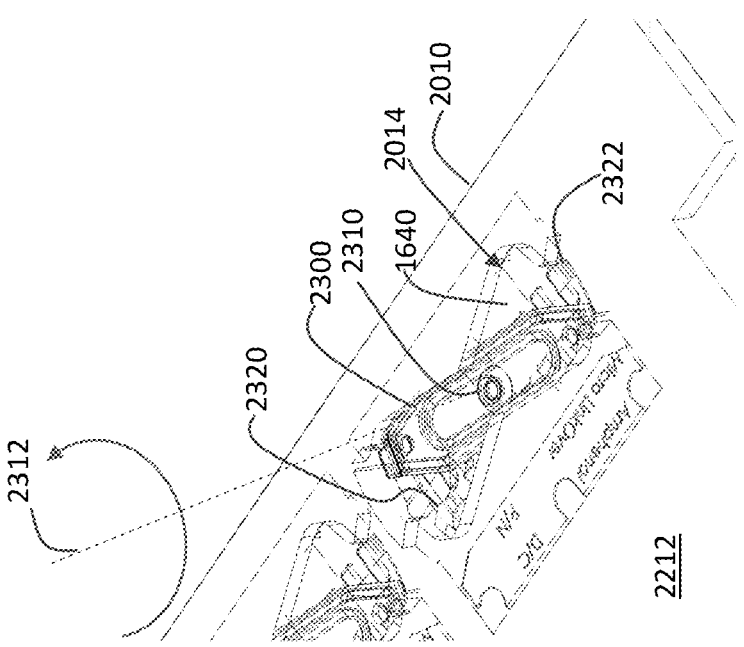
FIG. 23A is an enlarged view of a connector held in an organizer with a rotatable latch.

As shown in FIGS. 23A, 23B and 23C, tool 2350 has a first portion 2352, which may be used as a handle by a human operator or assembly automation equipment to hold the tool. A third portion 2356, which is shown at the opposite end of tool 2350 from the first portion is configured to engage with a latch member 2300. A second portion 2354 connects the first portion and the third portion 2356. In the example, the second portion and the third portion are sized to fit within opening 2322 in surface 2212 of organizer 2010.

In the example of FIGS. 23A, 23B and 23C, latch member 2300 is mounted to a connector 1640 to form a rotatable latch. In this example, connector 1640 has a protrusion 2310 through an upper surface. Latch member 2300 may be mounted to connector 1640 with protrusion 2310 through a hole 2302. Such a mounting may enable latch member 2300 to rotate about an axis 2312 extending perpendicular to the upper surface of connector 1640.

FIG. 23A shows a portion of surface 2212 of organizer 2010 including an opening 2014. Opening 2014 extends through surface 2212 to an opposing surface, not visible in FIG. 23A. In this example, at surface 2212 opening 2014 is not large enough for connector 1640 to pass through surface 2212. Rather connector 1640 is inserted into opening 2014 from the opposite surface where, similar to the openings 1914 shown in FIG. 20 in connection with organizer 1910, opening 2014 is large enough to receive connector 1640.

Openings 2014 may be configured to provide at least two engagement states with latching member 2300, one in which connector 1640 is held to the organizer and one in which it is released from the organizer. Opening 2014 may be sized to expose a central portion 2304 of latch member 2300 through surface 2212 in both the latched and released states. In the latched state, portions of latch member 2300 may be engaged with at least one surface of organizer 2010 to block motion in at least one direction within opening 2014.

Latching member 2300 may move between the latched and released states by rotating. To facilitate rotation of latching member 2300, latch member 2300 may have features that may engage a tool, such as tool 2350. In this example, latching member 2300 includes holes 2304. Posts 2358 on tool 2350 may fit within holes 2304 and engage latching member 2300 such that rotation of the first portion 2352 of tool 2350 rotates latching member 2300.

In the example of FIGS. 23A and 23B, latch member 2300 includes tabs 2302A and 2302B. When latch member is rotated into a latched state, tabs 2302A and 2302B may engage organizer 2010. In this example, organizer 2010 includes slots 2320 opening into openings 2014. When latch member 2300 is rotated counter clockwise around axis 2312, tabs 2302A and 2302B may rotate into respective slots 2320. The lower surfaces of slots 2320 form ledges that block downward motion within opening 2014 of latch member 2300, and connector 1640 to which it is attached. In this example, upwards motion is also blocked by the upper surfaces of slots 2320 engaging tabs 2302A and 2302B. However, in the illustrated embodiment, upwards motion of connector 1640 within opening 2014 is also limited because opening 2014 intersects surface 2212 with a cross section too small for connector 1640 to pass through surface 2212. Accordingly, some embodiments may include only the lower surface of slots 2320, serving as a ledge to block downward motion of connector 1640 when in a latched state.

When latch member 2300 is rotated clockwise around axis 2312, it is rotated into a released state. In the released state, tabs 2302A and 2302B may be positioned in respective clear areas 2322 of opening 2014. Clear areas 2322 extend through to the surface of organizer 2010 opposite surface 2212. In this state, connectors 1640 may move through opening 2014 to and through the opposite surface. By rotating latch member 2300 into this released state, the connectors 1640 in openings 2014 may move into engagement with mounting locations on PCB 1810. Connectors 1640 can also be removed from organizer 2010 and/or organizer 2010 can be removed from the subassembly 1700.

Portions of openings 2014 between the location in which the connectors are held in the latched position and the opposite surface may be sized to loosely hold connectors 1640 in an orientation with the mounting interfaces of the connectors parallel to the surface of the opposite surface. This sizing may enable the connectors, once released, to move through opening 2014. As the opposing surface may rest against a surface of PCB 1810, as shown in FIG. 22, the openings 2014 may guide the connectors 1640 toward mounting locations on PCB 1810 that are aligned with the openings. In some embodiments, the connectors 1640 and the mounting locations may include complementary guiding features. In such an embodiment, the openings 2014 may be sized to provide a coarse alignment between the connectors 1640 and mounting locations on PCB 1810, with fine alignment provided by the alignment features on the connectors and mounting locations.

Force on a connector 1640 to move the connector from a latched position within organizer 2010 into engagement with a mounting location on PCB 1810 may be supplied through a tool, such as 2350. In this example, second portion 2354 of tool 2350 is sized to pass through surface 2212 into opening 2014. Further, second portion 2354 is long enough that it can push a connector 1640 within opening 2014 far enough to engage a mounting location on PCB 1810 when organizer 2010 is aligned with the surface of PCB 1810, as shown in FIG. 22. Accordingly, by applying a twisting and a pushing force on the first portion 2352 of tool 2350 engaged to a connector 1640 latched in organizer 2010, connector 1640 may be released and then engaged with PCB 1810.

Figure 24:
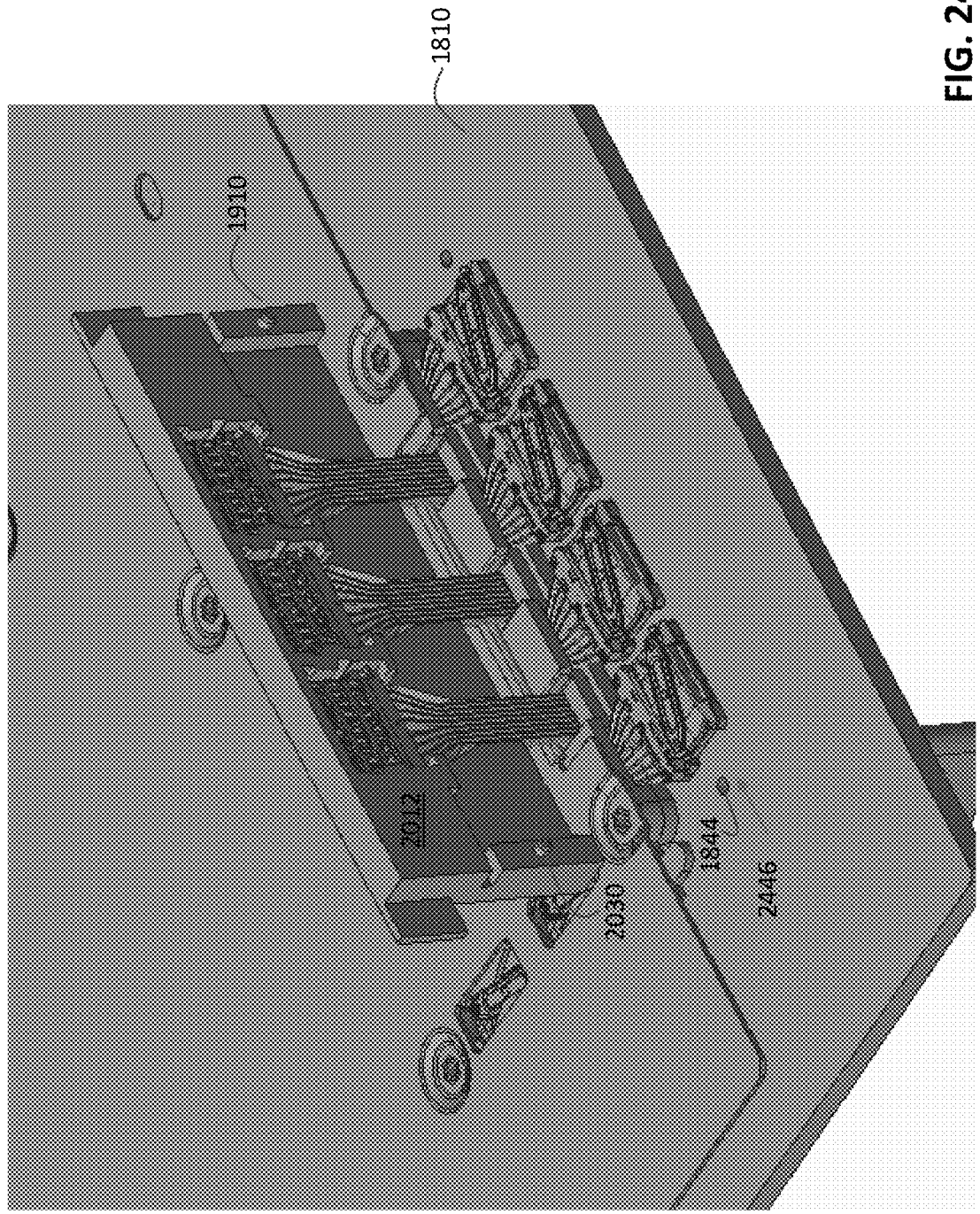
FIG. 24 is an isometric view of the portion of the electronic device of FIG. 20, in a state of manufacture in which connectors have been released from the second organizer and the second organizer has been removed.

FIG. 24 shows the portion of the electronic device illustrated in FIG. 22 after the connectors have been released from organizer 2010 and attached to PCB 1810. In this example, the four connectors held in organizer 2010 become a first linear array 2446 of group 1842. Group 1842 (FIG. 18) includes a second linear array 2448. The connectors in second linear array 2448 may be incorporated in subassembly 1700 initially attached to organizer 1910. During attachment of the connectors of the first linear array 2446, organizer 1910 may be moved out of the way, such as by being rotated into the position shown in FIG. 24. Once the connectors within organizer 2010 are attached to PCB 1810, organizer 2010 may be removed, as shown in FIG. 24. Organizer 1910 may then be rotated such that surface 2012 rests against PCB 1810. In this position, organizer 1910 may be positioned with respect to mounting locations for connectors latched within organizer 1910 via complementary alignment features, such as posts 2030 and holes 1844. The process of releasing the connectors from the organizer and attaching them to PCB 1810 used for the connectors in organizer 2010 may be repeated for the connectors in organizer 1910. These connectors may form the second linear array 2448 of group 1842. In this way, a group of connectors, which may be distributed in a two-dimensional pattern on the surface of PCB 1810, may be mounted to PCB 1810.

This process of attaching connectors to a substrate, such as PCB 1810, may be repeated for any number of groups of connectors within subassembly 1700. In this way, a large number of cabled interconnects may be made quickly and reliably as part of the manufacture of an electronic device.

Having thus described several embodiments, it is to be appreciated various alterations, modifications, and improvements may readily occur to those skilled in the art. Such alterations, modifications, and improvements are intended to be within the spirit and scope of the application. Accordingly, the foregoing description and drawings are by way of example only. Various changes may be made to the illustrative structures, materials and processes shown and described herein.

For example, connectors are described as releasably attached to an organizer via a mechanical latch. Other attachment mechanisms may be used, such as a weak adhesive, a magnet or a removable cover which, when in place, holds the connectors in openings within the organizer.

As another example, connectors are described as positioned in two dimensions by being inserted within openings in an organizer. Alternatively or additionally, the connector housings may have openings therethrough, and the position of the connector may be set by inserting posts fixed to the organizer through the openings. The connectors may be movable in a third dimension by sliding along the posts.

As yet a further example of a possible variation, embodiments were described in which a support of a subassembly provided mechanical functions, such as supporting connectors and cables and attaching to a substrate. Embodiments are possible in which the support of the subassembly provides electrical functions. The support, for example, may include a printed circuit board such that the second plurality of connectors may be as shown in FIG. 7, with some conductive elements connected to that printed circuit board and others connected to cables. With such a configuration, electronic components may be mounted on the PCB in the subassembly.

Further, embodiments were described in which mounting interfaces of connectors of a cabled interconnect subassembly to be mounted to a substrate are protected because the connectors are latched in an organizer with the mounting interface recessed into a surface of the organizer. Alternatively or additionally, a removable cap may be mounted over the surface of the organizer to protect the mounting interface. The cap may be removed, for example, after the subassembly is attached to the substrate and prior to attaching the connectors to the substrate.

As a further variation, in some embodiments, connectors may be attached to a substrate while held within an organizer. The mounting interfaces of the connectors, for example, may be aligned with or extend beyond a surface of the organizer such that, when the surface of the organizer rests against a PCB, the mounting interfaces of the connectors may engage with mounting locations on the PCB.

As a further example, organizers 1910 and 2010 are illustrated as movable and removable organizers. Other connectors that are part of subassembly 1700 may be attached to PCB 1810 without the use of a removable and/or removable organizer. For example, connectors 1840 are exposed through openings 1940 in support 1710. Openings 1940 provide the same access to a releasable latch that is available through openings 1914 in surface 1912 of an organizer 1910. Connectors 1840 may be held within a member that serves as an organizer. That organizer may be held to support 1710 in a predetermined location, positioning connectors 1840 relative to support 1710. Once subassembly 1700 is attached to PCB 1810, the organizer holding connectors 1840 may be positioned relative to mounting locations for connectors 1840 in the surface of PCB 1810. Connectors 1840 may then be released and attached to PCB 1810 in those mounting locations. In the illustrated embodiments, the same tools and techniques may be used as are used for releasing and attaching connectors 1640 withing organizers 1910 or 2010.

As an example of a further variation, embodiments of cabled interconnects terminated at a first end with pressure mount connectors were described. Alternatively or additionally, some or all of the cabled interconnects may be terminated with pressfit connectors that may be mounted to a PCB by pressing pressfit tails into plated vias in the PCB.

As another example, a plurality of cabled interconnects are illustrated in which multiple cabled interconnects within a subassembly are terminated at a first end with connectors of a first type and at the second end with connectors of a second type. In some embodiments, a mix of connector types may be used at either or both ends of the interconnects. Moreover, the size of the connectors at each end of the cabled interconnects may vary, whether or not the same type of connector is used. Some connectors of the first type, for example, may terminate 16 cables, while other connectors may terminate a greater or lesser number of cables.

Further, embodiments of a cabled interconnect subassembly are described including a mechanical support, cables, connectors terminating both a first and a second end of the cables and an organizer holding the connectors terminating at least the first end of the cables. In some embodiments, a cabled interconnect subassembly may include more or fewer components. For example, a cabled interconnect subassembly may include cables, connectors terminating some or all of the first ends of the cables, and one or more organizers holding some or all of the connectors. In some embodiments, some or all of the cables may be terminated at their second ends with connectors. In embodiments in which the connectors at the second end are not mounted to a support, those connectors may also be releasably held in an organizer.

Cabled interconnects as described herein may enable the manufacture of electronic devices with desirable signal integrity properties across a frequency range of interest. The frequency range of interest may depend on the operating parameters of the system in which such interconnects are used, but may have an upper limit between about 15 GHz and 75 GHz, such as 25, 56 or 60 GHz. Some electronic systems may have operating frequency ranges that span only a portion of this range, such as 1 to 10 GHz or 3 to 15 GHz or 5 to 35 GHz.

The operating frequency range for an interconnection system may be determined based on the range of frequencies that can pass through the interconnection with acceptable signal integrity. Signal integrity may be measured in terms of a number of criteria that depend on the application for which an interconnection system is designed. Some of these criteria may relate to the propagation of the signal along a single-ended signal path, a differential signal path, a hollow waveguide, or any other type of signal path. Two examples of such criteria are the attenuation of a signal along a signal path or the reflection of a signal from a signal path.

Other criteria may relate to interaction of multiple distinct signal paths. Such criteria may include, for example, near end cross talk, defined as the portion of a signal injected on one signal path at one end of the interconnection system that is measurable at any other signal path on the same end of the interconnection system. Another such criterion may be far end cross talk, defined as the portion of a signal injected on one signal path at one end of the interconnection system that is measurable at any other signal path on the other end of the interconnection system.

As specific examples, it could be required that signal path attenuation be no more than 3 dB power loss, reflected power ratio be no greater than −20 dB, and individual signal path to signal path crosstalk contributions be no greater than −50 dB. Because these characteristics are frequency dependent, the operating range of an interconnection system is defined as the range of frequencies over which the specified criteria are met.

According to an aspect of the present application, a subassembly is provided, comprising: a support; an organizer; a first plurality of connectors held to the organizer; a second plurality of connectors attached to the support; and a plurality of cables electrically connecting the first plurality of connectors and the second plurality of connectors.

In some embodiments, the first plurality of connectors are releasably held to the organizer. In some embodiments, such as those described above, the organizer comprises a plurality of openings; and the first plurality of connectors are disposed within the plurality of openings. In some embodiments, such as those described above, the organizer comprises a plurality of channels coupled to the plurality of openings; and segments of the plurality of cables are disposed within the plurality of channels. In some embodiments, such as those described above, the subassembly further comprises a cable guide secured to the support and comprising a plurality of cable receiving channels aligned with the plurality of channels of the organizer. In some embodiments, such as those described above, the organizer comprises a first surface and the plurality of openings extend through the first surface; each of the first plurality of connectors comprises a mounting interface; and the first plurality of connectors are held in the openings with the mounting interfaces facing in a direction normal to the first surface. In some embodiments, such as those described above, the organizer comprises a plurality of alignment posts extending in the direction normal to the first surface. In some embodiments, such as those described above, the organizer comprises a second surface, opposite the first surface; the plurality of openings extend between the first surface and the second surface; the first plurality of connectors are held in the openings with the mounting interfaces offset from the first surface in a direction towards the second surface. In some embodiments, such as those described above, the plurality of openings are sized and configured for the first plurality of connectors to slide within the plurality of openings to and through the first surface when released from the organizer. In some embodiments, such as those described above, the subassembly further comprises a plurality of latches holding the first plurality of connectors to the organizer, wherein the plurality of latches comprise releases configured for access from the second surface. In some embodiments, such as those described above, the plurality of connectors are latched to the organizer. In some embodiments, such as those described above, the organizer comprises a second surface, opposite the first surface; the subassembly comprises a plurality of latches latching the plurality of connectors to the organizer; the plurality of latches comprise releases; and the releases are exposed through openings in the second surface. In some embodiments, such as those described above, the latches comprise ledges in the organizer adjacent the plurality of openings and a plurality of members rotatably coupled to the first plurality of connectors; and the plurality of members are rotatable into a latched position in which the member engages a ledge of the plurality of ledges and a released position in which the member is free of the plurality of ledges. In any of the embodiments described above, the first plurality of connectors may comprise pressure mount connectors. In some embodiments, such as those described above, each of the first plurality of connectors comprises a housing with a ledge configured to engage a clip extending from a printed circuit board. In any of the embodiments described above, the first plurality of connectors may comprise press fit connectors. In any of the embodiments described above, the organizer may comprise a first surface and openings extending through the first surface; each connector of the first plurality of connectors may comprise a mounting interface; and the first plurality of connectors may be held to the support with the mounting interfaces exposed through the openings in the first surface. In some embodiments, such as those described above, the mounting interfaces of the first plurality of connectors comprise alignment features configured to engage complementary alignment features on a printed circuit board. In any of the embodiments described above, the support may comprise an edge; and the second plurality of connectors may be disposed in a linear array along the edge. In some embodiments, such as those described above, the edge is a first edge; the support comprises a second edge, opposite the first edge; and the organizer is disposed adjacent the second edge. In some embodiments, such as those described above, the organizer extends beyond the second edge of the support. In some embodiments, such as those described above, the support comprises attachment features configured for mechanical connection of the subassembly to a printed circuit board; and the organizer comprises alignment features configured to engage complementary alignment features on the printed circuit board.

According to an aspect of the present application, a method of attaching a plurality of connectors releasably held to an organizer to a substrate is provided, comprising: positioning the organizer with respect to the substrate; releasing the plurality of connectors from the organizer; and attaching the plurality of connectors to the substrate while the organizer is positioned with respect to the substrate. In some embodiments, the plurality of connectors are attached to the substrate after being released from the organizer. In some embodiments, such as those described above, releasing the plurality of connectors from the organizer comprises allowing motion of the plurality of connectors in a direction perpendicular to a surface of the substrate; and attaching the plurality of connectors to the substrate comprises applying force to the plurality of connectors in a direction perpendicular to the surface of the substrate. In any of the embodiments described above, the plurality of connectors may be attached to the substrate while being held to the organizer. In any of the embodiments described above, first ends of cables may be terminated to the plurality of connectors in the organizer; and positioning the organizer with respect to the substrate may comprise positioning the multiple connectors with respect to the substrate. In some embodiments, such as those described above, the plurality of connectors are a first plurality of connectors; and second ends of the cables, opposite the first ends, are terminated to a second plurality of connectors. In some embodiments, such as those described above, the cables, the first plurality of connectors, the second plurality of connectors, and the organizer comprise a subassembly; and positioning the organizer with respect to the substrate comprises positioning the subassembly with respect to the substrate. In some embodiments, such as those described above, the subassembly further comprises a support structure, and the second plurality of connectors are attached to the support structure; and positioning the organizer with respect to the substrate comprises attaching the support structure to the substrate. In some embodiments, such as those described above, positioning the organizer with respect to the substrate comprises engaging features of the organizer with features of the substrate. In some embodiments, such as those described above, the method further comprises, after releasing the attached first plurality of connectors, disengaging the features of the organizer with the features of the substrate and removing the organizer. In any of the embodiments described above, the plurality of connectors may be secured in the organizer by rotatable latches; and releasing the attached plurality of connectors from the organizer may comprise rotating the rotatable latches with a tool. In any of the embodiments described above, attaching the plurality of connectors to the substrate may comprise pressing compliant contacts of the plurality of connectors into mating contact with conductive contact areas on the substrate. In some embodiments, such as those described above, attaching the plurality of connectors to the substrate further comprises latching the plurality of connectors to the substrate with the compliant contacts of the plurality of connectors pressed into mating contact with the conductive contact areas. In any of the embodiments described above, the plurality of connectors secured in the organizer may be a first plurality of first type connectors and the organizer may be a first organizer; a second plurality of first type connectors may be secured in a second organizer; and the method may further comprise, after attaching first plurality of first type connectors to the substrate while secured in the first organizer and releasing the attached first plurality of first type connectors from the first organizer: positioning the second organizer with respect to the substrate; attaching the second plurality of first type connectors to the substrate while secured in the second organizer; and releasing the attached second plurality of first type connectors from the second organizer. In some embodiments, such as those described above, the substrate comprises an edge; attaching the first plurality of first type connectors to the substrate comprises attaching the first plurality of first type connectors within a first distance of the edge; and attaching the second plurality of first type connectors to the substrate comprises attaching the second plurality of first type connectors to the substrate at a distance greater than the first distance from the edge. In some embodiments, such as those described above, the first and second organizers are removably attached to a support; and the method further comprises: detaching the first organizer from the support after the first plurality of first type connectors are attached to the substrate; and detaching the second organizer from the support after the second plurality of first type connectors are attached to the substrate. In some embodiments, such as those described above, the second organizer is movable between a first position uncovering the first organizer and a second position; attaching the first plurality of first type connectors to the substrate and releasing the attached first plurality of first type connectors from the first organizer comprises attaching the first plurality of first type connectors to the substrate and releasing the attached first plurality of first type connectors from the first organizer while the second organizer is in the first position while the multiple connectors in the bottom organizer are being attached to the substrate; and attaching the second plurality of first type connectors to the substrate and releasing the attached second plurality of first type connectors from the second organizer comprises attaching the second plurality of first type connectors to the substrate and releasing the attached second plurality of first type connectors from the first organizer while the second organizer is in the second position. In some embodiments, such as those described above, the method further comprises rotating the second organizer from a first position to a second position after attaching the first plurality of first type connectors to the substrate and releasing the attached first plurality of first type connectors from the first organizer; and attaching the second plurality of first type connectors to the substrate and releasing the attached second plurality of first type connectors from the second organizer comprises attaching the second plurality of first type connectors to the substrate while the second organizer is in the second position.

According to an aspect of the present application, a kit is provided, comprising: an organizer configured to releasably hold a plurality of connectors in an orientation for attachment to a substrate; and a tool configured to release the plurality of connectors from the organizer. In some embodiments, the organizer comprises a plurality of openings therethrough, each opening of the plurality of openings configured to receive a connector of the plurality of connectors. In some embodiments, such as those described above, each opening of the plurality of openings is bounded by a ledge configured to engage a rotatable latch on a connector. In some embodiments, such as those described above, the tool comprises a first portion, a third portion, and a second portion between the first portion and the third portion; the first portion comprises a handle; the third is configured to engage with release mechanisms on the plurality of connectors; and the second portion is sized and configured to fit within the plurality of openings such that, when the second portion is engaged with a connector, a force on the handle after the connector is released from the organizer forces the connector to move within the opening. In some embodiments, such as those described above, the kit further comprises a plurality of connectors, wherein each of the plurality of connectors comprises a rotatable latch and is disposed within a respective opening of the plurality of openings. In some embodiments, such as those described above, the organizer has a first surface and a second surface; the plurality of openings extend between the first surface and the second surface; each of the plurality of connectors comprises a mounting side and an opposite latching side; for each of the plurality of connectors: the rotatable latch is rotatably attached to the latching side; and the connector is disposed within the respective opening of the plurality of openings with the mounting side exposed from the first surface and the rotatable latch exposed from the second surface. In some embodiments, such as those described above, the tool is configured to engage with the rotatable latches of the plurality of connectors. In some embodiments, such as those described above, the plurality of connectors are pressure mount connectors.

According to an aspect of the present application a subassembly is provided, comprising: a first organizer comprising a first surface; a first plurality of connectors releasably held to the first organizer, each of the first plurality of connectors comprising a mounting interface adjacent the first surface; and a second organizer comprising a first portion and a second portion, the first portion comprising a second surface and the second portion being recessed from the second surface, wherein the second organizer is sized and configured such that the first organizer nests within the first organizer with the first surface parallel to the second surface; and a second plurality of pressure mount connectors releasably held to the second organizer, wherein the second organizer is movable between a first position uncovering the first organizer and a second position covering the first organizer while the first organizer and the second organizer are connected to the support. In some embodiments, the subassembly further comprises multiple connectors removably secured in the first and second organizers. In some embodiments, such as those described above, the subassembly further comprises cables terminated to the multiple connectors in the first and second organizers. In some embodiments, such as those described above, the subassembly further comprises additional connectors at the opposite end of the cable from the multiple connectors in the organizers, wherein the additional connectors are attached to the support.

Accordingly, the present disclosure is not limited to the details of construction or the arrangements of components set forth in the following description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or additional items.

What is claimed is:

1. A method of attaching a plurality of connectors releasably held to an organizer to a substrate, comprising:
    positioning the organizer with respect to the substrate;
    releasing the plurality of connectors from the organizer;
    attaching the plurality of connectors to the substrate while the organizer is positioned with respect to the substrate, wherein attaching the plurality of connectors to the substrate comprises pressing compliant contacts of the plurality of connectors into mating contact with conductive contact areas on the substrate; and
    removing the organizer from the substrate.

2. The method of claim 1, wherein:
    the plurality of connectors are attached to the substrate after being released from the organizer.

3. The method of claim 1, wherein:
    the plurality of connectors are attached to the substrate while being held to the organizer.

4. The method of claim 1, wherein:
    the plurality of connectors are secured in the organizer by rotatable latches; and
    releasing the plurality of connectors from the organizer comprises rotating the rotatable latches with a tool.

5. The method of claim 1, wherein:
    attaching the plurality of connectors to the substrate comprises attaching the plurality of connectors to the substrate with first ends of cables terminated to the plurality of connectors in the organizer; and
    positioning the organizer with respect to the substrate comprises positioning the plurality of connectors with respect to the substrate.

6. The method of claim 5, wherein:
    the plurality of connectors are a first plurality of connectors;
    attaching the plurality of connectors to the substrate comprises attaching the plurality of connectors to the substrate with second ends of the cables, opposite the first ends, terminated to a second plurality of connectors.

7. The method of claim 6, wherein:
    positioning the organizer with respect to the substrate comprises attaching a support structure to the substrate with the second plurality of connectors attached to the support structure.

8. The method of claim 6, wherein:
    attaching the plurality of connectors to the substrate comprises attaching the plurality of connectors to the substrate with each connector of the second plurality of connectors comprising a mating interface arranged at a right angle with respect to the substrate.

9. The method of claim 8, wherein:
    attaching the plurality of connectors to the substrate comprises attaching the plurality of connectors to the substrate with each connector of the second plurality of connectors comprising pairs of signal conductors terminating a respective cable of the cables.

10. The method of claim 9, wherein:
    attaching the plurality of connectors to the substrate comprises attaching the plurality of connectors to the substrate with the pairs of the signal conductors of each connector of the second plurality of connectors being individually shielded.

11. The method of claim 1, wherein pressing compliant contacts of the plurality of connectors into mating contact with conductive contact areas on the substrate comprises:
    pressing, against conductive pads of the substrate, a compliant beam of each signal contact of a plurality of signal contacts of each connector of the plurality of connectors.

12. The method of claim 11, wherein pressing the compliant beams of the plurality of signal contacts against the conductive pads comprises:
    pressing the compliant beams of the plurality of signal contacts against the conductive pads with ground contacts of a plurality of ground contacts of each connector of the plurality of connectors being arranged adjacent to signal contacts of the plurality of signal contacts.

13. A method of attaching a plurality of connectors releasably held to an organizer to a substrate, comprising:
    positioning the organizer with respect to the substrate;
    releasing the plurality of connectors from the organizer; and
    attaching the plurality of connectors to the substrate while the organizer is positioned with respect to the substrate, wherein:
    releasing the plurality of connectors from the organizer comprises allowing motion of the plurality of connectors in a direction perpendicular to a surface of the substrate; and
    attaching the plurality of connectors to the substrate comprises applying force to the plurality of connectors in a direction perpendicular to the surface of the substrate.

14. The method of claim 13, wherein attaching the plurality of connectors to the substrate comprises pressing compliant contacts of the plurality of connectors into mating contact with conductive contact areas on the substrate.

15. A method of attaching a plurality of connectors releasably held to an organizer to a substrate, comprising:
    positioning the organizer with respect to the substrate;
    releasing the plurality of connectors from the organizer; and
    attaching the plurality of connectors to the substrate while the organizer is positioned with respect to the substrate, wherein:
    positioning the organizer with respect to the substrate comprises engaging features of the organizer with features of the substrate.

16. The method of claim 15, further comprising:
    after releasing the attached plurality of connectors, disengaging the features of the organizer with the features of the substrate and removing the organizer.

17. A method of attaching a plurality of connectors releasably held to an organizer to a substrate, comprising:
    positioning the organizer with respect to the substrate;
    releasing the plurality of connectors from the organizer; and
    attaching the plurality of connectors to the substrate while the organizer is positioned with respect to the substrate, wherein:
    the plurality of connectors secured in the organizer are a first plurality of first type connectors and the organizer is a first organizer;
    a second plurality of first type connectors are secured in a second organizer; and the method further comprises, after attaching the first plurality of first type connectors to the substrate while secured in the first organizer and releasing the attached first plurality of first type connectors from the first organizer:
- positioning the second organizer with respect to the substrate;
- attaching the second plurality of first type connectors to the substrate while secured in the second organizer; and
- releasing the attached second plurality of first type connectors from the second organizer.

18. The method of claim 17, wherein:
the substrate comprises an edge;
attaching the first plurality of first type connectors to the substrate comprises attaching the first plurality of first type connectors within a first distance of the edge; and
attaching the second plurality of first type connectors to the substrate comprises attaching the second plurality of first type connectors to the substrate at a distance greater than the first distance from the edge.

19. The method of claim 17, wherein:
the first and second organizers are removably attached to a support; and
the method further comprises:
- detaching the first organizer from the support after the first plurality of first type connectors are attached to the substrate; and
- detaching the second organizer from the support after the second plurality of first type connectors are attached to the substrate.

20. The method of claim 17, wherein:
the second organizer is movable between a first position uncovering the first organizer and a second position;
attaching the first plurality of first type connectors to the substrate and releasing the attached first plurality of first type connectors from the first organizer comprises attaching the first plurality of first type connectors to the substrate and releasing the attached first plurality of first type connectors from the first organizer while the second organizer is in the first position while the first plurality of first type connectors in the first organizer are being attached to the substrate;
the method further comprises rotating the second organizer from the first position to the second position after attaching the first plurality of first type connectors to the substrate and releasing the attached first plurality of first type connectors from the first organizer; and
attaching the second plurality of first type connectors to the substrate and releasing the attached second plurality of first type connectors from the second organizer comprises attaching the second plurality of first type connectors to the substrate and releasing the attached second plurality of first type connectors from the second organizer while the second organizer is in the second position.

* * * * *